(12) United States Patent
Ito et al.

(10) Patent No.: US 9,337,213 B2
(45) Date of Patent: May 10, 2016

(54) SEMICONDUCTOR DEVICE AND METHOD FOR MANUFACTURING SAME

(71) Applicant: Sharp Kabushiki Kaisha, Osaka-shi, Osaka (JP)

(72) Inventors: Kazuatsu Ito, Osaka (JP); Yutaka Takamaru, Osaka (JP); Tadayoshi Miyamoto, Osaka (JP); Mitsunobu Miyamoto, Osaka (JP); Makoto Nakazawa, Osaka (JP); Yasuyuki Ogawa, Osaka (JP); Seiichi Uchida, Osaka (JP); Shigeyasu Mori, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/389,812

(22) PCT Filed: Mar. 29, 2013

(86) PCT No.: PCT/JP2013/059615
§ 371 (c)(1),
(2) Date: Oct. 1, 2014

(87) PCT Pub. No.: WO2013/150981
PCT Pub. Date: Oct. 10, 2013

(65) Prior Publication Data
US 2015/0053969 A1    Feb. 26, 2015

(30) Foreign Application Priority Data
Apr. 4, 2012    (JP) ................................ 2012-085903

(51) Int. Cl.
*H01L 27/12*    (2006.01)
*H01L 29/417*    (2006.01)
(Continued)

(52) U.S. Cl.
CPC ........ *H01L 27/124* (2013.01); *H01L 21/32051* (2013.01); *H01L 21/76823* (2013.01);
(Continued)

(58) Field of Classification Search
CPC ............ H01L 27/1244; H01L 27/3279; H01L 21/76825
See application file for complete search history.

(56) References Cited

U.S. PATENT DOCUMENTS

2010/0127263 A1* 5/2010 Lee ...................... H01L 27/124
257/59
2011/0017989 A1* 1/2011 Chen ................... H01L 27/1225
257/43

(Continued)

FOREIGN PATENT DOCUMENTS

JP    2011-053443 A    3/2011
JP    2011-091279 A    5/2011
(Continued)

*Primary Examiner* — Ngan Ngo
*Assistant Examiner* — Stephen Bradley
(74) *Attorney, Agent, or Firm* — Keating & Bennett, LLP

(57) ABSTRACT

This semiconductor device (100) includes: a gate electrode (3); a gate insulating layer (4); an oxide layer (50) which is formed on the gate insulating layer (4) and which includes a first conductor region (55) and a first semiconductor region (51) that overlaps at least partially with the gate electrode (3) with the gate insulating layer (4) interposed between them; a source electrode (6s) formed to contact with the upper surface of the first semiconductor region (51) of the oxide layer (50); a drain electrode (6d) which is formed to contact with the upper surface of the first semiconductor region (51) of the oxide layer (50) and which is electrically connected to the first conductor region (55); and a conductive layer (60) which is formed in contact with the upper surface of the oxide layer (50) and which a plurality of holes (66) or notches. The oxide layer (50) has a plurality of second conductor regions (57, 58), and each of which has a surface exposed inside respective one of the holes or notches of the conductive layer.

12 Claims, 23 Drawing Sheets

(51) Int. Cl.
  *H01L 21/3205* (2006.01)
  *H01L 21/768* (2006.01)
  *H01L 29/786* (2006.01)
  *H01L 21/02* (2006.01)

(52) U.S. Cl.
  CPC .... *H01L21/76825* (2013.01); *H01L 21/76826* (2013.01); *H01L 21/76829* (2013.01); *H01L 21/76838* (2013.01); *H01L 27/1225* (2013.01); *H01L 27/1244* (2013.01); *H01L 27/1259* (2013.01); *H01L 29/41733* (2013.01); *H01L 29/41758* (2013.01); *H01L 29/7869* (2013.01); *H01L 29/78693* (2013.01); *H01L 21/02554* (2013.01); *H01L 21/02565* (2013.01)

(56) References Cited

U.S. PATENT DOCUMENTS

| | | |
|---|---|---|
| 2011/0050551 A1 | 3/2011 | Ota et al. |
| 2011/0095295 A1* | 4/2011 | Nam ............... H01L 27/12 257/59 |
| 2011/0297942 A1* | 12/2011 | Kim ............... H01L 27/3276 257/59 |
| 2012/0138922 A1 | 6/2012 | Yamazaki et al. |

FOREIGN PATENT DOCUMENTS

| | | |
|---|---|---|
| JP | 2012-134475 A | 7/2012 |
| WO | 2012/053415 A1 | 4/2012 |

* cited by examiner (a)

(b)

(a)

(b)

(c)

(a)

(b)

(c)

(d)

(e)

(f)

(a)

(b)

(a)

(b)

SEMICONDUCTOR DEVICE AND METHOD FOR MANUFACTURING SAME

TECHNICAL FIELD

The present invention relates to a semiconductor device formed using an oxide semiconductor and a method for fabricating such a device, and more particularly relates to an active-matrix substrate for use in a liquid crystal display device or an organic EL display device and a method for fabricating such a substrate. In this description, the "semiconductor devices" include an active-matrix substrate and a display device which uses the active-matrix substrate.

BACKGROUND ART

An active-matrix substrate for use in a liquid crystal display device and other devices includes switching elements such as thin-film transistors (which will be simply referred to herein as "TFTs"), each of which is provided for an associated one of pixels. An active-matrix substrate including TFTs as switching elements is called a "TFT substrate".

As for TFTs, a TFT which uses an amorphous silicon film as its active layer (and will be referred to herein as an "amorphous silicon TFT") and a TFT which uses a polysilicon film as its active layer (and will be referred to herein as a "polysilicon TFT") have been used extensively.

Recently, people have proposed that an oxide semiconductor be used as a material for the active layer of a TFT instead of amorphous silicon or polysilicon. Such a TFT will be referred to herein as an "oxide semiconductor TFT". Since an oxide semiconductor has higher mobility than amorphous silicon, the oxide semiconductor TFT can operate at higher speeds than an amorphous silicon TFT. Also, such an oxide semiconductor film can be formed by a simpler process than a polysilicon film.

Patent Document No. 1 discloses a method for fabricating a TFT substrate including oxide semiconductor TFTs. According to the method disclosed in Patent Document No. 1, a TFT substrate can be fabricated in a reduced number of manufacturing process steps by forming a pixel electrode with the resistance of the oxide semiconductor layer locally lowered.

CITATION LIST

Patent Literature

Patent Document No. 1: Japanese Laid-Open Patent Publication No. 2011-91279

SUMMARY OF INVENTION

Technical Problem

Patent Document No. 1 just discloses the structures of oxide semiconductor TFTs and pixel electrodes on the TFT substrate and does not mention the structures of lines and terminal portions.

The present inventors discovered via experiments that if the TFT substrate as disclosed in Patent Document No. 1 should be fabricated with the number of manufacturing process steps and the manufacturing cost cut down, portions of the source line layer (e.g., some source lines) would be formed on the oxide semiconductor film in some cases. However, it turned out that the source line layer easily peeled off the surface of the oxide semiconductor film, thus possibly causing a decrease in yield eventually. This problem will be discussed in further detail later.

It is therefore an object of an embodiment of the present invention to provide a TFT substrate which can be fabricated by a simple process with the decrease in yield minimized and which contributes to realizing a display device with a higher definition and a higher aperture ratio than conventional ones and also provide a method for fabricating such a TFT substrate.

Solution to Problem

A semiconductor device according to an embodiment of the present invention includes: a substrate; a gate electrode formed on the substrate; a gate insulating layer formed over the gate electrode; an oxide layer which is formed on the gate insulating layer and which includes a first semiconductor region and a first conductor region, wherein the first semiconductor region overlaps at least partially with the gate electrode with the gate insulating layer interposed between them; a source electrode formed to contact with the upper surface of the first semiconductor region of the oxide layer; a drain electrode which is formed to contact with the upper surface of the first semiconductor region of the oxide layer and which is electrically connected to the first conductor region; and a conductive layer which is formed to contact with the upper surface of the oxide layer and which has a plurality of holes or notches. The oxide layer includes a plurality of second conductor regions, and each of which has a surface exposed inside respective one of the plurality of holes or notches of the conductive layer.

In one preferred embodiment, the conductive layer includes a line, and the line has at least some of the plurality of holes or notches.

In one preferred embodiment, the semiconductor device further includes an insulating layer covering the conductive layer, and in the at least some of the holes or notches of the line, at least some of the plurality of second conductor regions are in contact with the insulating layer.

In one preferred embodiment, the semiconductor device further includes a terminal portion. The conductive layer includes a source connecting layer arranged in the terminal portion, and the source connecting layer has at least some of the plurality of holes or notches. And the terminal portion includes an external connecting layer which contacts with not only the upper surface of the source connecting layer but also at least some of the plurality of second conductor regions inside the at least some of the holes or notches of the source connecting layer.

In one preferred embodiment, the conductive layer has either a mesh pattern or a striped pattern.

In one preferred embodiment, the semiconductor device further includes a terminal portion, the oxide layer further includes another conductor region located in the terminal portion, and the terminal portion includes an external connecting layer which contacts with the upper surface of that another conductor region.

In one preferred embodiment, the conductive layer is formed out of the same conductive film as the source and drain electrodes.

In one preferred embodiment, the semiconductor device further includes: an upper insulating layer formed over the source and drain electrodes; and an upper transparent electrode formed on the upper insulating layer. The upper transparent electrode overlaps at least partially with the conductor region with the upper insulating layer interposed between them.

In one preferred embodiment, the oxide layer includes In, Ga and Zn.

In one preferred embodiment, the plurality of second conductor regions and the first conductor region are more heavily doped with a dopant than the first semiconductor region is.

A method for fabricating a semiconductor device according to an embodiment of the present invention includes the steps of: (A) providing a substrate having a gate electrode and a gate insulating layer formed on a surface thereof; (B) forming an oxide semiconductor layer on the gate insulating layer and forming a source electrode, a drain electrode and a conductive layer which contact with the upper surface of the oxide semiconductor layer, the conductive layer having a plurality of holes or notches which expose the upper surface of the oxide semiconductor layer; (C) forming a protective layer which covers at least a portion of the oxide semiconductor layer to be a channel region; and (D) forming an oxide layer including a first conductor region, a first semiconductor region including a channel region, and a plurality of second conductor regions by performing a resistance lowering process to lower the resistance of a portion of the oxide semiconductor layer. In this step (D), the first conductor region is formed in a portion of the oxide semiconductor layer which is covered with neither the protective layer nor the conductive layer. The plurality of second conductor regions are formed in portions of the conductive layer which are exposed inside the holes or notches. And the first semiconductor region is formed in a portion of the oxide semiconductor layer that has not had its resistance lowered.

In one preferred embodiment, the conductive layer includes a line, and the line has at least some of the plurality of holes or notches.

In one preferred embodiment, the conductive layer includes a source connecting layer, and the source connecting layer has at least some of the plurality of holes or notches, and the method includes, after the step (D), the step of forming an external connecting layer which contacts with not only the upper surface of the source connecting layer but also at least some of the plurality of second conductor regions.

In one preferred embodiment, the oxide semiconductor layer includes In, Ga and Zn.

Advantageous Effects of Invention

Embodiments of the present invention provide a semiconductor device which can be fabricated by a simple process with the decrease in yield minimized and which contributes to realizing a display device with a higher definition and a higher aperture ratio than conventional ones and also provide a method for fabricating such a semiconductor device. More specifically, in a semiconductor device including an conductive layer (such as a source line) which is formed to contact with the upper surface of an oxide layer including a semiconductor region to be an active layer for a TFT, a decrease in yield to be caused when the conductive layer peels off the upper surface of the oxide layer can be minimized. In addition, since the pixel electrode is formed by lowering the resistance of the oxide layer, the number of manufacturing process steps can be reduced and the aperture ratio can be increased compared to conventional ones.

DESCRIPTION OF EMBODIMENTS

Figure 1:
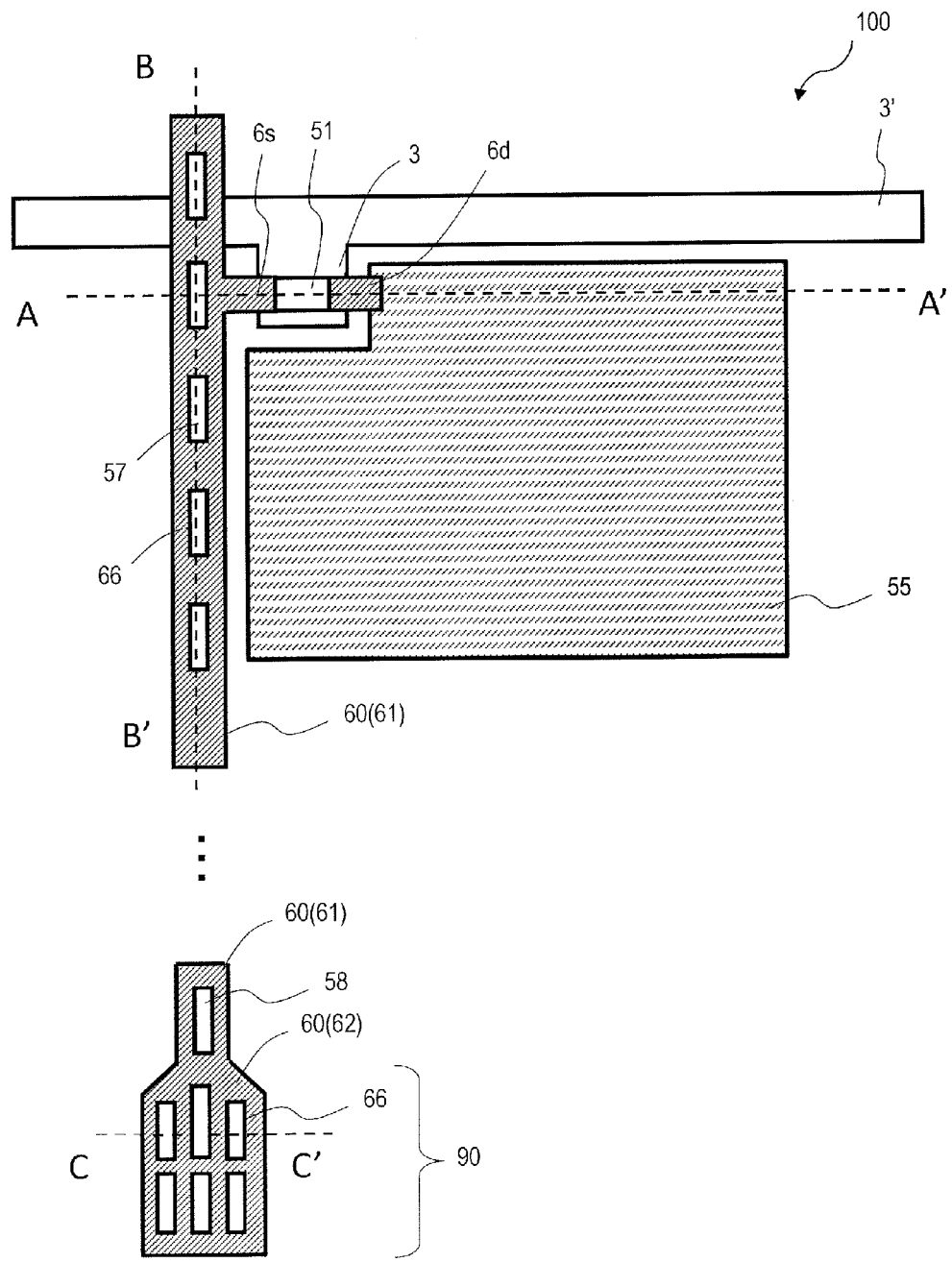
FIG. 1 A schematic plan view illustrating a TFT substrate 100 according to a first embodiment of the present invention.

The present inventors studied various methods for fabricating a TFT substrate easily by using a portion of an oxide semiconductor film as the active layer of a TFT and lowering the resistance of another portion of the oxide semiconductor film and using it as a pixel electrode. In this case, depending on the manufacturing process adopted, an oxide film which has had its resistance lowered partially may be located under, and may contact with, a line. Particularly when a configuration in which the line is extended from a terminal portion on a TFT substrate to a TFT in the display area is adopted, an oxide film will be present under the line if the number of manufacturing process steps is reduced in one way or another. However, the present inventors discovered and confirmed via experiments that the closeness of contact between the line and the oxide film was so low that the line peeled off easily and the yield could decrease eventually.

The present inventors also discovered that particularly when an oxide film which had had its resistance lowered locally was formed by subjecting an oxide semiconductor film to a resistance lowering process in a state where the oxide semiconductor film was in contact with the line, the closeness of contact between the oxide film and the line further decreased. A similar problem will also arise when a heat treatment is carried out for a different purpose other than the resistance lowering process.

The line peeling phenomenon may be observed on a line extended from a driver circuit which is formed in an area other than the display area (i.e., in the peripheral area) or on a source line (data signal line) within the display area. Likewise, a connecting layer which is formed out of the same layer as the line may also peel off in the terminal portion. In the terminal portion, the connecting layer and an oxide film under the connecting layer contact with each other in so large an area that the connecting layer will peel off easily to possibly cause a decrease in yield.

The present inventors discovered that by cutting a plurality of holes or notches through a conductive layer (such as a line or a connecting layer) which was arranged to contact with the upper surface of an oxide film, the area of contact between the conductive layer and the oxide film could be reduced and the conductive layer could be prevented from peeling off. According to this configuration, portions of the oxide film have their resistance lowered and turn into conductor regions under the conductive layer. As a result, an increase in resistance value (such as a wiring resistance value) that would be caused by cutting those holes through the conductive layer can be minimized.

(Embodiment 1)

Hereinafter, a semiconductor device as a first embodiment of the present invention will be described with reference to the accompanying drawings. A semiconductor device according to this embodiment includes a thin-film transistor which has an active layer made of an oxide semiconductor (and which will be referred to herein as an "oxide semiconductor TFT"). A semiconductor device according to this embodiment just needs to include an oxide semiconductor TFT and may be implemented broadly as an active-matrix substrate or any of various kinds of display devices and electronic devices.

In the following description, a semiconductor device according to an embodiment of the present invention will be described as being applied to an oxide semiconductor TFT for use in a liquid crystal display device.

Figure 2:
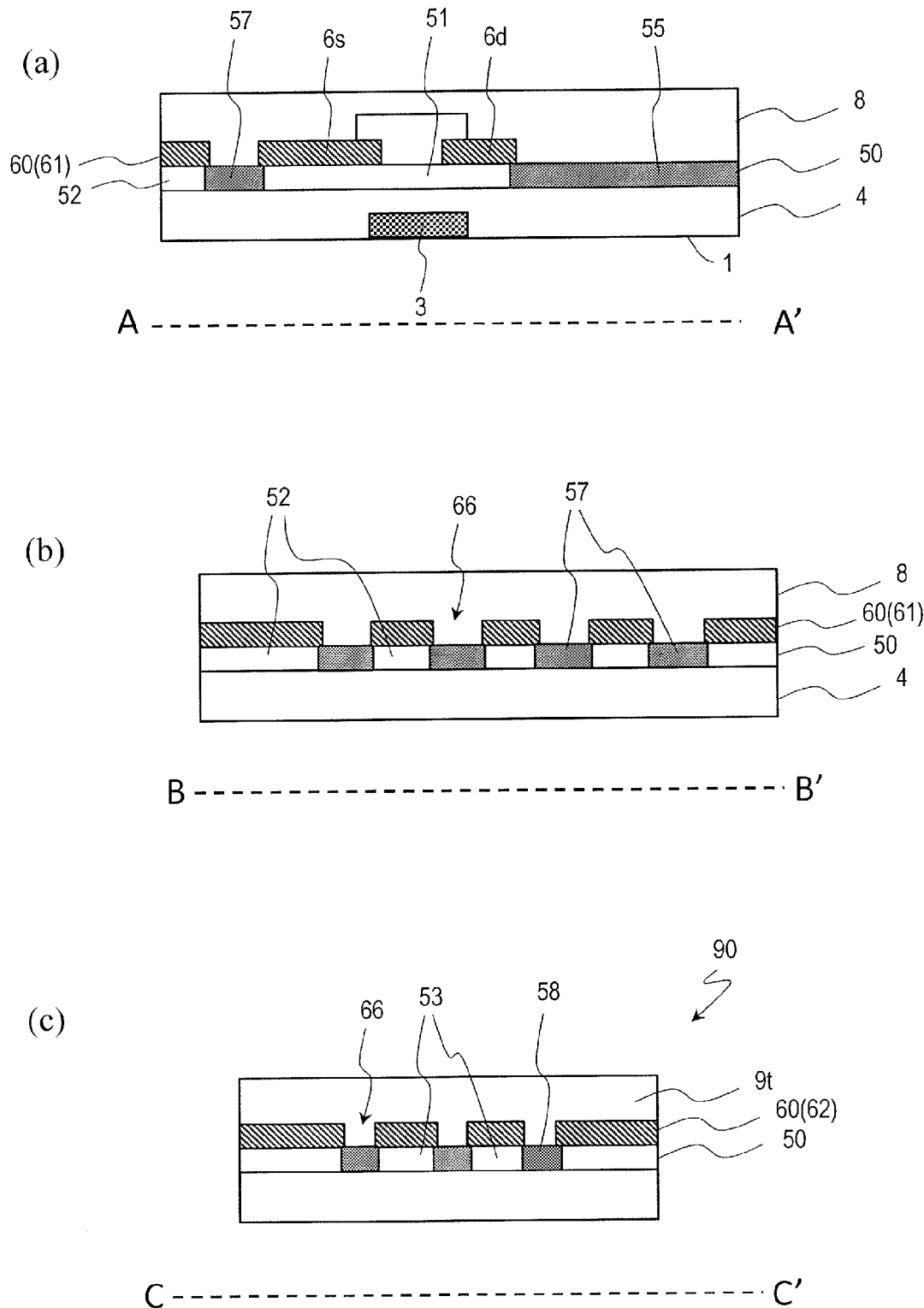
FIG. 2 (a) to (c) are cross-sectional views of the TFT substrate 100 shown in FIG. 1 as respectively viewed on the planes B-B' and C-C', wherein (a) illustrates a cross section covering a TFT, (b) illustrates a cross section covering a line portion, and (c) illustrates a cross section covering a terminal portion.

FIG. 1 is a schematic plan view illustrating a TFT substrate 100 according to an embodiment. FIGS. 2(*a*) to 2(*c*) are cross-sectional views of the TFT substrate 100 shown in FIG. 1 as respectively viewed on the planes B-B' and C-C'. Specifically, FIG. 2(*a*) illustrates a cross section covering a TFT, FIG. 2(*b*) illustrates a cross section covering a line portion, and FIG. 2(*c*) illustrates a cross section covering a terminal portion.

This TFT substrate 100 includes a substrate 1, a gate electrode 3 formed on the substrate 1, a gate insulating layer 4 formed over the gate electrode 3, and an oxide layer 50 formed on the gate insulating layer 4. On the oxide layer 50, a source electrode 6s, a drain electrode 6d and a conductive layer 60 are formed to contact with the upper surface of the oxide layer 50. An upper insulating layer 8 is formed over the source and drain electrodes 6s, 6d and the conductive layer 60. Although not shown, the TFT substrate 100 may further include an upper transparent electrode which is formed on the upper insulating layer 8.

The oxide layer 50 includes semiconductor regions 51, 52, 53 and conductor regions 55, 57, 58, which have a lower electrical resistance (of 100 kΩ/sq or less, suitably 10 kΩ/sq or less) than the semiconductor regions 51, 52, 53. Although it depends on what processing method is taken to lower the resistance, the conductor regions 55, 57, 58, for example, may be doped more heavily with a dopant (such as boron) than the semiconductor regions 51, 52, 53 are. The semiconductor region 51 is arranged to overlap with the gate electrode 3 with the gate insulating layer 4 interposed between them, and functions as the active layer of the TFT. The conductor region 55 is arranged to contact with the semiconductor region 51 and may function as a transparent electrode (such as a pixel electrode).

The source and drain electrodes 6s and 6d are arranged to contact with the upper surface of the semiconductor region (active layer) 51. If the conductor region 55 is used as a pixel electrode, the drain electrode 6d is electrically connected to the conductor region 55. In that case, a portion of the drain electrode 6d suitably contacts with a portion of the upper surface of the conductor region 55.

The conductive layer 60 may include a line (e.g., a source line in this example) 61. The line 61 is connected to the source electrode 6s. A number of holes 66 are formed in the line 61 to expose the surface of the oxide layer 50. Alternatively, instead of cutting those holes 66, notches may be made along the outer periphery of the line 61. In this description, the "notches" refer herein to recesses which have been made along the periphery of the conductive layer's (60) pattern when the conductive layer 60 is viewed from above.

As shown in FIG. 2(b), portions of the oxide layer which overlap with the line 61 include a plurality of conductor regions 57. Those conductor regions 57 have their upper surface exposed inside the holes 66 (or notches) that are formed in the line 61. That is why those conductor regions 57 contact at least partially with the upper insulating layer 8 inside the holes 66 (or notches). Those conductor regions 55 are suitably separated from each other. The rest of those portions of the oxide layer 50 that overlap with the line 61, other than the conductor regions 57, are semiconductor regions 52.

The conductive layer 60 may include a source connecting layer 62 which is formed in the source line layer. The source connecting layer 62 may be arranged in a terminal portion 90 to be connected to an external line or in a source-gate connecting portion to be connected to a gate connecting layer which is formed in the gate line layer.

As shown in FIG. 2(c), the terminal portion 90 includes the oxide layer 50, the source connecting layer 62, and an external connecting layer 9t. If an upper transparent electrode is provided on the upper insulating layer 8, the external connecting layer 9t may be formed out of the same conductive film as the upper transparent electrode. The source connecting layer 62 has a number of holes 66 which expose the surface of the oxide layer 50. Alternatively, instead of cutting those holes 66, notches may be made along the outer periphery of the line 61.

Portions of the oxide layer 50 which overlap with the source connecting layer 62 include a plurality of conductor regions 58. Those conductor regions 58 have their upper surface exposed inside the holes 66 (or notches) that are formed in the source connecting layer 62. The rest of those portions of the oxide layer 50 that overlap with the source connecting layer 62, other than the conductor regions 58, are semiconductor regions 53. In the example illustrated in FIG. 2(c), the external connecting layer 9t contacts with the upper surface of the source connecting layer 62, the side surface of the holes 66, and the conductor regions 58 inside the holes 66.

According to this embodiment, the holes 66 or notches may be cut through both or either of the line 61 and the source connecting layer 62. Alternatively, holes or notches may also be cut through the conductive layer 60 which is arranged in a region other than the line portion or the terminal portion.

According to this embodiment, in the TFT substrate 100, conductor regions 55 to be pixel electrodes, for example, may be formed by locally lowering the resistance of the oxide layer 50, and the portions remaining as semiconductor can turn into the semiconductor region 51 to be the active layer of the TFT. Thus, the manufacturing process can be simplified. In addition, by cutting a plurality of holes or notches through the conductive layer 60 which contacts with the upper surface of the oxide layer 50, the area of contact between the conductive layer 60 and the oxide layer 50 can be reduced. Consequently, even if the oxide layer 50 is subjected to a heat treatment to perform a resistance lowering process or for any other purpose, it is possible to prevent the conductive layer 60 from peeling off the upper surface of the oxide layer 50.

In addition, according to this embodiment, an increase in resistance value (such as the wiring resistance value or the terminal portion's resistance value) that would be caused by cutting a plurality of holes through the conductive layer 60 (including the line 61 and the source connecting layer 62) can be minimized. The conductor regions created in the oxide layer 50 will outgrow due to diffusion, for example, the regions defined by the holes that are formed in the conductive layer 60. Thus, the peripheral portion of each of those conductor regions 57 contacts with the lower surface of the conductive layer 60, and therefore, the conductor region 57 gets electrically connected to the conductive layer 60. As a result, each conductor region 57 can also function as a part of the line or source connecting layer. Consequently, it is possible to prevent the line 61 and source connecting layer 62 from peeling off while minimizing the increase in the wiring resistance value or the resistance of the terminal portion.

In the example illustrated in FIGS. 1 and 2, each hole of the conductive layer 60 (including the line 61 and the source connecting layer 62) has a slit shape. Those slits are arranged in line (i.e., to form a single stripe) in the same direction. The interval between adjacent ones of the slits may fall within the range of 2 μm to 10 μm, for example. As a result, the conductive layer 60 can be prevented more effectively from peeling off with the increase in wiring resistance value minimized.

The conductive layer 60 is suitably formed out of the same conductive film as the source and drain electrodes 6s and 6d. In this description, such a layer which is formed out of the same conductive film as the source and drain electrodes 6s and 6d will be sometimes referred to herein as a "source line layer".

However, this is not the only pattern that the conductive layer 60 may have. Rather, the conductive layer 60 suitably has a mesh pattern or a striped pattern. In that case, the area of contact between the conductive layer 60 and the oxide layer 50 can be reduced even more effectively, and the conductive layer 60 is even less likely to peel off. Also, even if film peeling has occurred, that peeling can be limited to a very small area. Consequently, the decrease in yield due to film peeling can be minimized even more efficiently.

Figure 3:
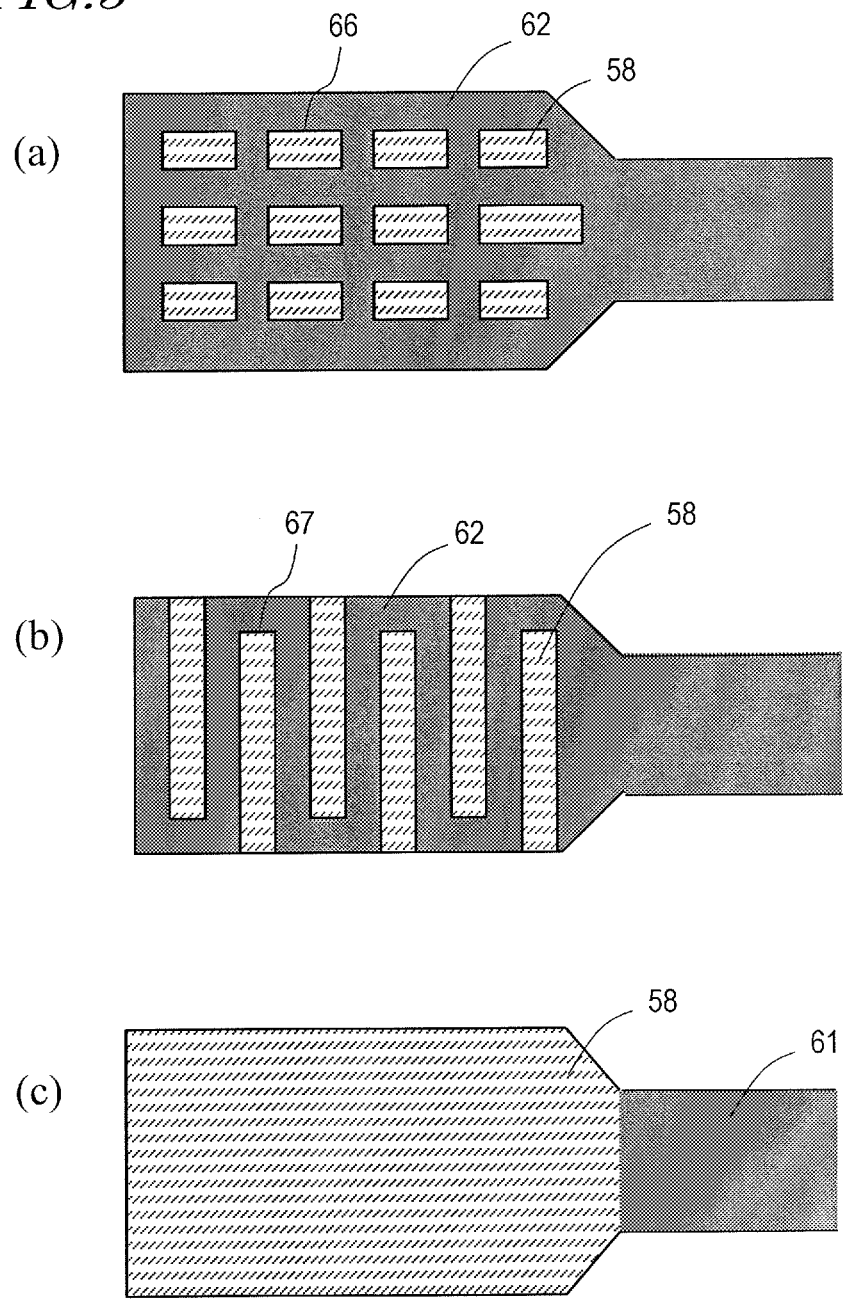
FIG. 3 (a) to (c) are plan views illustrating other exemplary terminal portions of the TFT substrate 100.

FIGS. 3(a) and 3(b) are enlarged top views illustrating other examples of the source connecting layer 62. As shown in FIG. 3(a), the respective holes 66 may be arranged as a grid. Alternatively, the source connecting layer 62 may also have a plurality of notches along the outer peripheries. In this example, the notches 67 are slits which run in a predetermined direction.

Still alternatively, as shown in FIG. 3(c), the conductive layer 60 may be removed from the terminal portion and the oxide layer 50 that should be located under the conductive layer 60 may be exposed. In that case, the exposed oxide layer 50 is a conductor region 58 which has had its resistance lowered. Although not shown, an external connecting layer is arranged to contact with the upper surface of the conductor region 58. As a result, the external connecting layer and the line 61 can be electrically connected together via the conductor region 58.

If the conductor region 55 is made to function as a pixel electrode, a portion of the conductor region 55 suitably contacts directly with the lower surface of the drain electrode 6d. By adopting such a structure, the pixel electrode can be extended to almost reach the end portion of the drain electrode 6d. As a result, the TFT substrate 100 can have a higher aperture ratio than the TFT substrate disclosed in Patent Document No. 1.

Hereinafter, the respective components of this TFT substrate 100 will be described in detail one by one.

The substrate 1 is typically a transparent substrate and may be a glass substrate, for example, but may also be a plastic substrate. Examples of the plastic substrates include a substrate made of either a thermosetting resin or a thermoplastic resin and a composite substrate made of these resins and an inorganic fiber (such as glass fiber or a non-woven fabric of glass fiber). A resin material with thermal resistance may be polyethylene terephthalate (PET), polyethylene naphthalate (PEN), polyether sulfone (PES), an acrylic resin, or a polyimide resin, for example. Also, when used in a reflective liquid crystal display device, the substrate 1 may also be a silicon substrate.

The gate electrode 3 is electrically connected to a gate line 3'. The gate electrode 3 and the gate line 3' may have a multilayer structure, of which the upper layer is a W (tungsten) layer and the lower layer is a TaN (tantalum nitride) layer, for example. Alternatively, the gate electrode 3 and the gate line may also have a multilayer structure consisting of Mo (molybdenum), Al (aluminum) and Mo layers or may even have a single-layer structure, a double layer structure, or a multilayer structure consisting of four or more layers. Still alternatively, the gate electrode 3a may be made of an element selected from the group consisting of Cu (copper), Al, Cr (chromium), Ta (tantalum), Ti (titanium), Mo and w or an alloy or metal nitride which is comprised mostly of any of these elements. The thickness of the gate electrode 3 may fall within the range of about 50 nm to about 600 nm, for example. In this embodiment, the gate electrode 3 has a thickness of approximately 420 nm.

The gate insulating layer 4 may also be a single layer or a multilayer structure of $SiO_2$ (silicon dioxide), $SiN_x$ (silicon nitride), $SiO_xN_y$ (silicon oxynitride, where x>y), $SiN_xO_y$ (silicon nitride oxide, where x>y), $Al_2O_3$ (aluminum oxide), or tantalum oxide ($Ta_2O_5$). The thickness of the gate insulating layer 4 suitably falls within the range of about 50 nm to about 600 nm. To prevent dopants from diffusing from the substrate 1, the insulating layer 4a is suitably made of $SiN_x$ or $SiN_xO_y$ (silicon oxynitride, where x>y). Moreover, to prevent the semiconductor properties of the semiconductor region 51 from deteriorating, the insulating layer 4b is suitably made of either $SiO_2$ or $SiO_xN_y$ (silicon nitride oxide, where x>y). Furthermore, to form a dense gate insulating layer 4 which causes little gate leakage current at low temperatures, the gate insulating layer 4 is suitably formed with a rare gas of Ar (argon), for example, used.

The oxide layer 50 may include an In—Ga—Zn—O based oxide (which will be referred to herein as an "In—Ga—Zn—O based oxide"), for example. In this case, the In—Ga—Zn—O based oxide is a ternary oxide of In (indium), Ga (gallium) and Zn (zinc). The ratios (i.e., mole fractions) of In, Ga and Zn are not particularly limited. For example, In:Ga:Zn=2:2:1, In:Ga:Zn=1:1:1 or In:Ga:Zn=1:1:2 may be satisfied. In this embodiment, an In—Ga—Zn—O based oxide film including In, Ga and Zn at the ratio of 1:1:1 is used. If such an In—Ga—Zn—O based oxide film is used as the oxide layer 50, the semiconductor region 51 to be a channel region for a TFT becomes an In—Ga—Zn—O based semiconductor region. In this description, an In—Ga—Zn—O based oxide which exhibits a semiconductor property will be referred to herein as an "In—Ga—Zn—O based semiconductor". A TFT, of which the active layer is an In—Ga—Zn—O based semiconductor region, has high mobility (which is more than 20 times as high as that of an a-Si TFT) and low leakage current (which is less than one hundredth of that of an a-Si TFT), and therefore, can be used effectively as a driver TFT and a pixel TFT.

The oxide layer 50 does not have to be made of an In—Ga—Zn—O based oxide, but may also include a Zn—O based (ZnO) oxide, an In—Zn—O based (IZO™) oxide, a Zn—Ti—O based (ZTO) oxide, a Cd—Ge—O based oxide, a Cd—Pb—O based oxide, CdO (cadmium oxide), an Mg—Zn—O based oxide, an In—Sn—Zn—O based oxide (such as $In_2O_3$—$SnO_2$—ZnO) or an In—Ga—Sn—O based oxide, for example. Furthermore, the oxide layer 50 may also be made of ZnO in an amorphous state, a polycrystalline state, or a microcrystalline state (which is a mixture of amorphous and polycrystalline states) to which one or multiple dopant elements selected from the group consisting of Group I, Group XIII, Group XIV, Group XV and Group XVII elements have been added, or may even be ZnO to which no dopant elements have been added at all. An amorphous oxide film is suitably used as the oxide layer 50, because the semiconductor device can be fabricated at a low temperature and can achieve high mobility in that case. The thickness of the oxide layer 50 may fall within the range of about 30 nm to about 100 nm, for example (e.g., approximately 50 nm).

The oxide layer 50 of this embodiment includes a high-resistance portion which functions as a semiconductor and a low-resistance portion which has a lower electrical resistance than the high-resistance portion does. In the example illustrated in FIG. 1, the high-resistance portion includes the semiconductor regions 51, 52, and 53, while the low-resistance portion includes the conductor regions 55, 57 and 58. Such an oxide layer 50 may be formed by lowering the resistance of a portion of the oxide semiconductor film. Although it depends on what method is used to lower the resistance, the low-resistance portion may be doped more heavily with a p-type dopant (such as B (boron)) or an n-type dopant (such as P (phosphorus)) than the high-resistance portion is. The low-resistance portion may have an electrical resistance of 100 kΩ/sq or less, and suitably has an electrical resistance of 10 kΩ/sq or less.

The source line layer (including the source and drain electrodes 6s and 6d and the conductive layer 60 in this case) may have a multilayer structure comprised of Ti, Al and Ti layers, for example. Alternatively, the source line layer may also have a multilayer structure comprised of Mo, Al and Mo layers or may even have a single-layer structure, a double layer structure or a multilayer structure consisting of four or more layers. Furthermore, the source line layer may also be made of an element selected from the group consisting of Al, Cr, Ta, Ti, Mo and W, or an alloy or metal nitride comprised mostly of any of these elements. The thickness of the source line layer may fall within the range of about 50 nm to about 600 nm (e.g., approximately 350 nm), for example.

Hereinafter, an exemplary method for fabricating the TFT substrate 100 will be described.

FIGS. 4(a) through 4(e) and FIGS. 5(a) and 5(b) are schematic cross-sectional views illustrating an exemplary series of manufacturing process steps to fabricate the TFT substrate 100. On these drawings, illustrated are cross-sectional structures of a line portion and a display area. However, illustration of the cross-sectional structure of the terminal portion will be omitted herein, because the cross-sectional structure of the terminal portion is the almost same as that of the line portion.

First of all, as shown in FIG. 4(a), a gate electrode 3 is formed on a substrate 1. As the substrate 1, a transparent insulating substrate such as a glass substrate, for example, may be used. The gate electrode 3 may be formed by depositing a conductive film on the substrate 1 by sputtering process and then patterning the conductive film by photolithographic process. In this example, a multilayer film with a double layer structure consisting of a TaN film (with a thickness of about 50 nm) and a W film (with a thickness of about 370 nm) that have been stacked one upon the other in this order on the substrate 1 is used as the conductive film. As this conductive film, a single-layer film of Ti, Mo, Ta, W, Cu, Al or Cr, a multilayer film or alloy film including any of these elements in combination, or a metal nitride film thereof may also be used.

Next, as shown in FIG. 4(b), a gate insulating layer is deposited over the gate electrode 3 by CVD (chemical vapor deposition) process. After that, an oxide semiconductor film 50' is formed thereon.

The gate insulating layer 4 may be made of $SiO_2$, $SiN_x$, $SiO_xN_y$ (silicon oxynitride, where x>y), $SiN_xO_y$ (silicon nitride oxide, where x>y), $Al_2O_3$, or $Ta_2O_5$, for example. In this embodiment, the gate insulating layer 4 may be formed to have a multilayer structure comprised of an $SiN_x$ film (with a thickness of about 325 nm) as the lower layer and an $SiO_2$ film (with a thickness of about 50 nm) as the upper layer.

The oxide semiconductor film 50' may be deposited over the gate insulating layer 4 by sputtering process, for example.

The oxide semiconductor film 50' may include an In—Ga—Zn—O based semiconductor, for example. The oxide semiconductor material included in the oxide semiconductor film 50' does not have to be an In—Ga—Zn—O based semiconductor, but may also be a Zn—O based semiconductor (ZnO), an In—Zn—O based semiconductor (IZO™), a Zn—Ti—O based semiconductor (ZTO), a Cd—Ge—O based semiconductor, a Cd—Pb—O based semiconductor, CdO (cadmium oxide), an Mg—Zn—O based semiconductor, an In—Sn—Zn—O based semiconductor (such as $In_2O_3$—$SnO_2$—ZnO) or an In—Ga—Sn—O based semiconductor, for example. The thickness of the oxide semiconductor film 50' may fall within the range of about 30 nm to about 100 nm, for example. In this example, an In—Ga—Zn—O based semiconductor film (with a thickness of approximately 50 nm) is used as the oxide semiconductor film 50'.

The In—Ga—Zn—O based semiconductor may be either amorphous or crystalline. If the In—Ga—Zn—O based semiconductor is a crystalline one, a crystalline In—Ga—Zn—O based semiconductor, of which the c axis is substantially perpendicular to the layer plane, is suitably used. The crystal structure of such an In—Ga—Zn—O based semiconductor is disclosed, for example, in Japanese Laid-Open Patent Publication No. 2012-134475, the entire disclosure of which is hereby incorporated by reference. Furthermore, the oxide semiconductor film 50' may also be ZnO in an amorphous state, a polycrystalline state, or a microcrystalline state (which is a mixture of amorphous and polycrystalline states) to which one or multiple dopant elements selected from the group consisting of Group I, Group XIII, Group XIV, Group XV and Group XVII elements have been added, or may even be ZnO to which no dopant elements have been added at all. If an amorphous oxide semiconductor film is used as the oxide semiconductor film 50', the semiconductor device can be fabricated at a low temperature and can achieve high mobility.

Thereafter, as shown in FIG. 4(c), a source line layer including a source electrode 6s, a drain electrode 6d and a conductive layer 60 is formed. The source line layer may be obtained by depositing a conductive film (not shown) over the oxide semiconductor film 50' by sputtering process and then patterning the conductive film, for example. In this embodiment, when the conductive film is patterned, the oxide semiconductor film 50' is also patterned, thereby obtaining the oxide layer 50.

Figure 6:
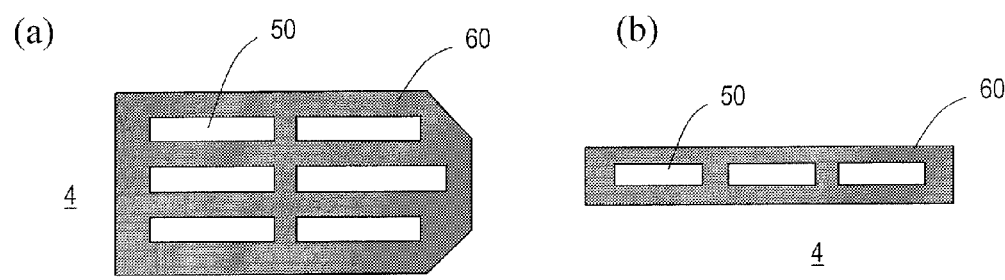
FIG. 6 (a) and (b) illustrate the planar shapes of the terminal portion and line in the process step shown in FIG. 4(c).

The conductive film to be the source line layer may have a multilayer structure comprised of Ti, Al and Ti layers, for example. The lower Ti layer may have a thickness of about 50 nm, the Al layer may have a thickness of about 200 nm, and the upper Ti layer may have a thickness of about 100 nm, for example. In this embodiment, first of all, a resist pattern, of which the thickness varies partially, is formed on the conductive film by performing a photolithographic process using a half-tone mask. The resist pattern may be formed to be thicker over the portions to be a channel region and holes (or notches) than everywhere else. Next, the conductive film and the oxide semiconductor film 50' are patterned simultaneously by dry etching process and aching process. In this manner, the oxide semiconductor film 50' is patterned into an intended shape to form an oxide layer 50, and a source electrode 6s, a drain electrode 6d and a conductive layer 60 with a plurality of holes or notches are formed out of the conductive film. In this case, when viewed along a normal to the substrate 1, the respective outer peripheries of the patterns defining the conductive layer 60 and the oxide layer 50 are substantially aligned with each other as shown in FIGS. 6(a) and 6(b), but the surface of the oxide layer 50 is exposed between the source and drain electrodes 6s and 6d (i.e., a portion to be a channel) and inside those holes or notches. In this state, the oxide layer 50 is a semiconductor layer (oxide semiconductor layer). By forming the source and drain electrodes 6s and 6d and patterning the oxide semiconductor film 50' using a single photomask in this manner, the manufacturing process can be simplified and the manufacturing cost can be cut down.

Those holes or notches are suitably cut through portions of the conductive layer 60 where film peeling would be a particularly serious problem. For example, when viewed along a normal to the substrate 1, those holes or notches are suitably arranged in an elongate portion of the conductive layer 60 (e.g., an extended line of a peripheral driver circuit and a data signal line to be formed in the display area) and in a portion with a large area (e.g., in the connecting layer of the terminal portion).

Subsequently, as shown in FIG. 4(d), an insulating protective layer 8b is formed by sputtering and photolithographic processes so as to cover the channel region of the oxide semiconductor film 50'. The insulating protective layer 8b may be made of an insulating oxide (such as $SiO_2$), for example, and may have a thickness of about 100 nm. Also, when viewed along a normal to the substrate 1, an end portion of the insulating protective layer 8b suitably overlaps with the drain electrode 6d. Then, the oxide layer 50 will be able to have its resistance lowered to its portion which is located near the end portion of the drain electrode 6d and a conductor region (transparent electrode) will be formed in a subsequent process step.

Thereafter, as shown in FIG. 4(e), portions of the oxide layer 50 are subjected to a resistance lowering process L, thereby defining conductor regions 55, 57 and 58. Specifically, portions of the oxide layer 50 which are not covered with any of the source electrode 6s, drain electrode 6d, insulating protective layer 8b and conductive layer 60 have their resistance lowered to be conductor regions 55. In the same way, portions of the oxide layer 50 which are exposed inside the holes or notches of the conductive layer 60 also have their resistance lowered to be conductor regions 57 and 58. The rest of the oxide layer 50 which has not had its resistance lowered is left as semiconductor regions 51, 52 and 53. The electrical resistance of those portions that have been subjected to this resistance lowering process L (which will be referred to herein as "low-resistance portions") is lower than that of the other portions that have not been subjected to the resistance lowering process L (which will be referred to herein as "high resistance portions").

The resistance lowering process L may be plasma processing or doping a p-type dopant or an n-type dopant, for example. If a region that needs to have its resistance lowered is doped with a p-type dopant or an n-type dopant, then the dopant concentration of the conductor regions 55, 57, 58 becomes higher than that of the semiconductor regions 51, 52, 53. As will be described later, if a dopant is going to be implanted using a doping system, the upper insulating layer could be formed over the oxide layer 50 and then the resistance lowering process could be carried out by implanting the dopant through the upper insulating layer 8.

Due to diffusion of the dopant, sometimes a portion of the oxide layer 50 which is located under the end portion of the drain electrode 6d may also have its resistance lowered and eventually form part of the conductor region 55. In that case, the conductor region 55 will contact directly with the drain electrode 6d. In the same way, when viewed along a normal to the substrate 1, the conductor regions 57 and 58 may also grow to be one size larger than the holes of the conductive layer 60 and may contact directly with the lower surface of the conductive layer 60.

However, this is not the only method for performing the resistance lowering process L. Examples of alternative resistance lowering processes L include hydrogen plasma processing using a CVD system, argon plasma processing using an etching system, and an annealing process under a reducing ambient.

Figure 7:
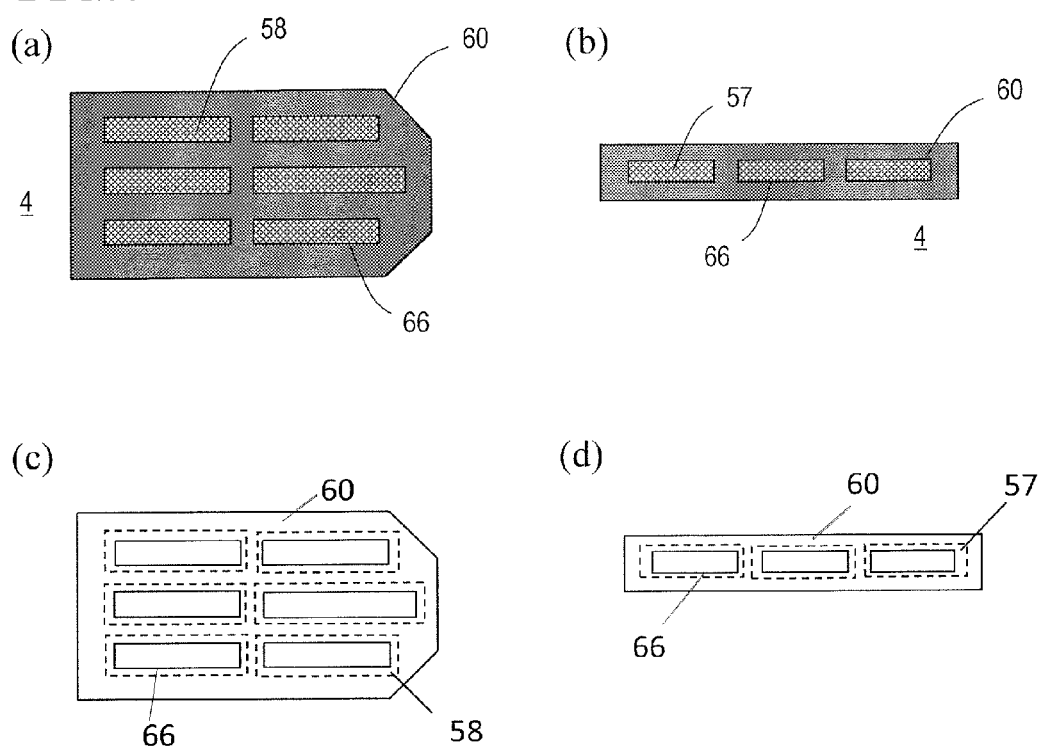
FIG. 7 (a) and (b) illustrate planar shapes of the terminal portion and line that have been subjected to the resistance lowering process shown in FIGS. 4(e), and (c) and (d) illustrate other exemplary planar shapes of the terminal portion and line.

FIGS. 7(a) and 7(b) are enlarged plan views illustrating the conductive layer 60 and oxide layer 50 which have been subjected to the resistance lowering process L. As shown in FIGS. 7(a) and 7(b), the conductor regions 57 and 58 are formed in those portions that are exposed inside the holes 66 of the conductive layer 60. It should be noted that due to diffusion of the dopant, for example, those conductor regions and 58 could grow to be one size larger than their associated holes 66 as shown in FIGS. 7(c) and 7(d) when viewed along a normal to the substrate 1. In that case, those conductor regions 57 and 58 will contact directly with the lower surface of the conductive layer 60 in their peripheral portions.

Thereafter, as shown in FIG. 5(a), an upper insulating layer (passivation film) 8 is formed so as to cover the source line layer and the oxide layer 50. In this embodiment, an $SiO_2$ film (with a thickness of 200 nm, for example) is deposited as the upper insulating layer 8.

In this example, the upper insulating layer 8 is formed so as to contact with the conductor regions 55, 57 and 58 of the oxide layer 50. Although not shown, a hole is cut through a predetermined region of the upper insulating layer 8 using a photomask (not shown). For example, contact holes which reach the source and drain electrodes 6s and 6d, respectively, and a hole which reaches the source connecting layer at the terminal portion are also cut by known methods.

Thereafter, if it is necessary according to the display mode adopted, a transparent conductive film may be deposited as shown in FIG. 5(b) to a thickness of 100 nm, for example, on the upper insulating layer 8 and then patterned to form an upper transparent electrode 9. As the transparent conductive film, an ITO (indium tin oxide) film, an IZO film or any other suitable film may be used. Although not shown, the upper transparent electrode 9 also fills the hole of the upper insulating layer 8 and is connected to a predetermined potential. Furthermore, although not shown, by patterning the transparent conductive film in the terminal portion, the external connecting layer 9t shown in FIG. 1(c) is formed.

According to this method, a highly reliable semiconductor device, in which the conductive layer 60 hardly peels off, can be provided without increasing the number of manufacturing process steps or the number of masks to use.

Although the configuration of the TFT substrate 100 in the display area and terminal portion is described, such a configuration that uses the conductor regions of the oxide layer 50 may also be used in other areas as well.

Hereinafter, an exemplary configuration which uses such conductor regions for a source-gate connecting portion will be described.

Figure 8:
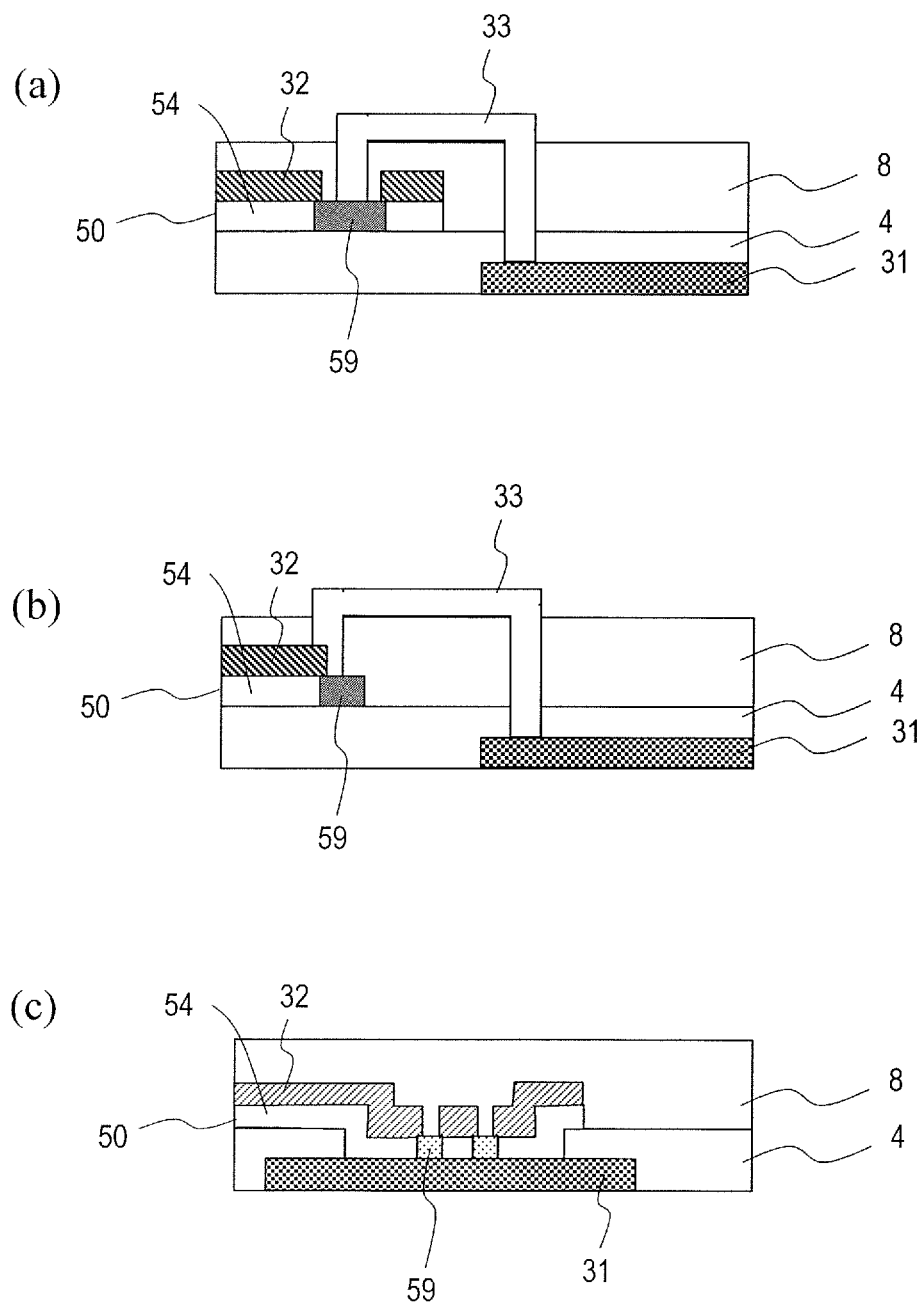
FIG. 8 (a) to (c) are cross-sectional views illustrating exemplary configurations for a source-gate connecting portion in the TFT substrate 100.

FIGS. 8(a) to 8(c) are cross-sectional views illustrating a source-gate connecting portion which is used to connect a source line layer and a gate line layer together.

The source-gate connecting portion shown in FIG. 8(a) includes a gate connecting layer 31 in a gate line layer, a source connecting layer 32 in a source line layer, and a transparent connecting layer 33 formed out of the same transparent conductive film as the upper transparent electrode. The source connecting layer 32 is in contact with the upper surface of the oxide layer 50. A hole is formed in the source connecting layer 32 to expose the upper surface of the oxide layer 50. That portion of the oxide layer 50 that is exposed inside the hole is a conductor region 59 which has had its resistance lowered, while the rest of the oxide layer 50 that has not had its resistance lowered is a semiconductor region 54. A portion of the upper surface of the conductor region 59 is in contact with the source connecting layer 32. The transparent connecting layer 33 contacts with the gate connecting layer 31 inside a hole which is formed in the insulating layers 4 and 8 and also contacts with the conductor region 59 inside a hole is formed in the upper insulating layer 8. Consequently, the gate connecting layer 31 and the source connecting layer 32 are electrically connected together via the transparent connecting layer 33 and the conductor region 59 of the oxide layer 50.

In the configuration shown in FIG. 8(b), a source connecting layer 32 has a notched portion, and a conductor region 59 has been defined in a portion of an oxide layer 50 which is exposed by the notched portion. A transparent connecting layer 33 is provided to contact with a gate connecting layer 31, the conductor region 59 and the source connecting layer 32. As a result, the gate connecting layer and the source connecting layer 32 can be electrically connected together via the transparent connecting layer 33 and the conductor region 59 of the oxide layer 50.

Alternatively, as shown in FIG. 8(c), a gate connecting layer 31 and the conductor region 59 of an oxide layer 50 may contact with each other inside a hole which is formed in a gate insulating layer 4. In this manner, a source connecting layer 32 and the gate connecting layer 31 may be electrically connected together via the conductor region 59 even without providing a transparent connecting layer 33.

Hereinafter, other embodiments of a semiconductor device according to the present invention will be described. Even though the structures of a display area and a line portion are illustrated for the embodiments to be described below, the terminal portion may have the same structure as the one illustrated in FIG. 3 and illustration of its structure will be omitted.

(Embodiment A1)

FIG. 9(a) is a schematic plan view illustrating a TFT substrate 100A(1) according to Embodiment A1. FIG. 9(b) is a cross-sectional view of the semiconductor device (TFT substrate) 100A as viewed on the plane A1-A1' shown in FIG. 9(a). And FIG. 9(c) is a schematic cross-sectional view of a liquid crystal display device 500 including the TFT substrate 100A(1). In FIG. 9(c), the dotted arrows indicate the directions of an electric field.

This TFT substrate 100A(1) includes an upper transparent electrode 9 on the upper insulating layer 8, which is a difference from the TFT substrate 100 shown in FIGS. 1 and 2.

At least a part of the upper transparent electrode 9 suitably overlaps with the conductor region (lower transparent electrode) 55 with the upper insulating layer 8 interposed between them. As a result, a storage capacitor is formed in the region where these two transparent electrodes overlap with each other. However, this storage capacitor is transparent (i.e., can transmit visible light), and does not decrease the aperture ratio. Consequently, this TFT substrate 100A(1) can have a higher aperture ratio than a conventional TFT substrate with a storage capacitor including a non-transparent electrode formed out of a metal film (such as a gate metal layer or a source metal layer). On top of that, since the aperture ratio is not decreased by the storage capacitor, the capacitance value of the storage capacitor (i.e., the area of the storage capacitor) can be increased as needed, which is also advantageous. In the example illustrated in FIG. 9(a), the upper transparent electrode 9 is formed so as to cover almost the entire pixel (but the area where the TFT is present).

The gate insulating layer 4 of this embodiment includes two insulating layers 4a and 4b, of which the one contacting directly with the semiconductor region 51 of the oxide layer 50 (e.g., the insulating layer 4b in this embodiment) suitably includes an oxide insulating layer. If the oxide insulating layer directly contacts with the semiconductor region 51, oxygen included in the oxide insulating layer will be supplied to the semiconductor region 51, thus preventing oxygen deficiencies in the semiconductor region 51 from deteriorating the properties of the semiconductor. The insulating layer 4b may be an $SiO_2$ (silicon dioxide) layer, for example. The insulating layer 4a may be an $SiN_x$ (silicon nitride) layer, for example. In this embodiment, the insulating layer 4a may have a thickness of approximately 325 nm, the insulating layer 4b may have a thickness of approximately 50 nm, and the gate insulating layer 4 may have an overall thickness of approximately 375 nm, for example.

The upper insulating layer 8 may have a multilayer structure, and may include an insulating protective layer 8b which contacts with the channel region of the semiconductor region 51. In addition, the upper insulating layer 8 may further include a dielectric layer which is interposed between the two transparent electrodes, for example. In this embodiment, the upper insulating layer 8 includes an insulating protective layer 8b and an insulating layer 8a which is stacked on the insulating protective layer 8b.

The insulating protective layer 8b is suitably made of an insulating oxide (such as $SiO_2$). If the insulating protective layer 8b is made of an insulating oxide, it is possible to prevent the oxygen deficiencies in the semiconductor region 51 of the oxide layer from deteriorating the semiconductor properties. Alternatively, the insulating protective layer 8b may also be made of SiON (which may be either silicon oxynitride or silicon nitride oxide), $Al_2O_3$ or $Ta_2O_5$, for example. The thickness of the insulating protective layer 8b may fall within the range of about 50 nm to about 300 nm, for example. In this embodiment, the insulating protective layer 8b has a thickness of about 150 nm, for example.

In this description, an insulating layer (e.g., the insulating layer 8a in this embodiment) which is formed between the lower transparent electrode (conductor region) 55 and the upper transparent electrode 9 to produce storage capacitance there will be sometimes referred to herein as a "dielectric layer". The dielectric layer may include $SiN_x$, for example. Alternatively, the dielectric layer may also be made of $SiO_xN_y$ (silicon oxynitride, where x>y), $SiN_xO_y$ (silicon nitride oxide, where x>y), $Al_2O_3$ (aluminum oxide), or tantalum oxide ($Ta_2O_5$). The thickness of the dielectric layer may fall within the range of about 100 nm to about 500 nm (e.g., approximately 200 nm).

The upper transparent electrode 9 is formed out of a transparent conductive film such as an ITO film or an IZO film. The thickness of the upper transparent electrode 9 may fall within the range of 20 nm to 200 nm. In this embodiment, the upper transparent electrode 9 has a thickness of about 100 nm.

As shown in FIG. 9(c), the TFT substrate 100A(1) may be used in a fringe field switching (FFS) mode liquid crystal display device 500, for example. In this case, the conductor region 55 of the oxide layer 50 is used as a pixel electrode to which a display signal voltage is applied, and the upper transparent electrode 9 is used as a common electrode (to which either a common voltage or a counter voltage is applied). At least one slit is cut through the upper transparent electrode 9. An FFS mode liquid crystal display device 500 with such a configuration is disclosed in Japanese Laid-Open Patent Publication No. 2011-53443, for example, the entire disclosure of which is hereby incorporated by reference.

This liquid crystal display device 500 includes the TFT substrate 100A(1), a counter substrate 200, and a liquid crystal layer 150 interposed between the TFT substrate 100A(1) and the counter substrate 200. In this liquid crystal display device 500, no counter electrode such as a transparent electrode of ITO, for example, is arranged on the surface of the counter substrate 200 to face the liquid crystal layer 150. Instead, a display operation is carried out by controlling the alignments of liquid crystal molecules in the liquid crystal layer 150 with a lateral electric field which is generated by the pixel and common electrodes that are formed on the TFT substrate 100A(1).

Figure 4:
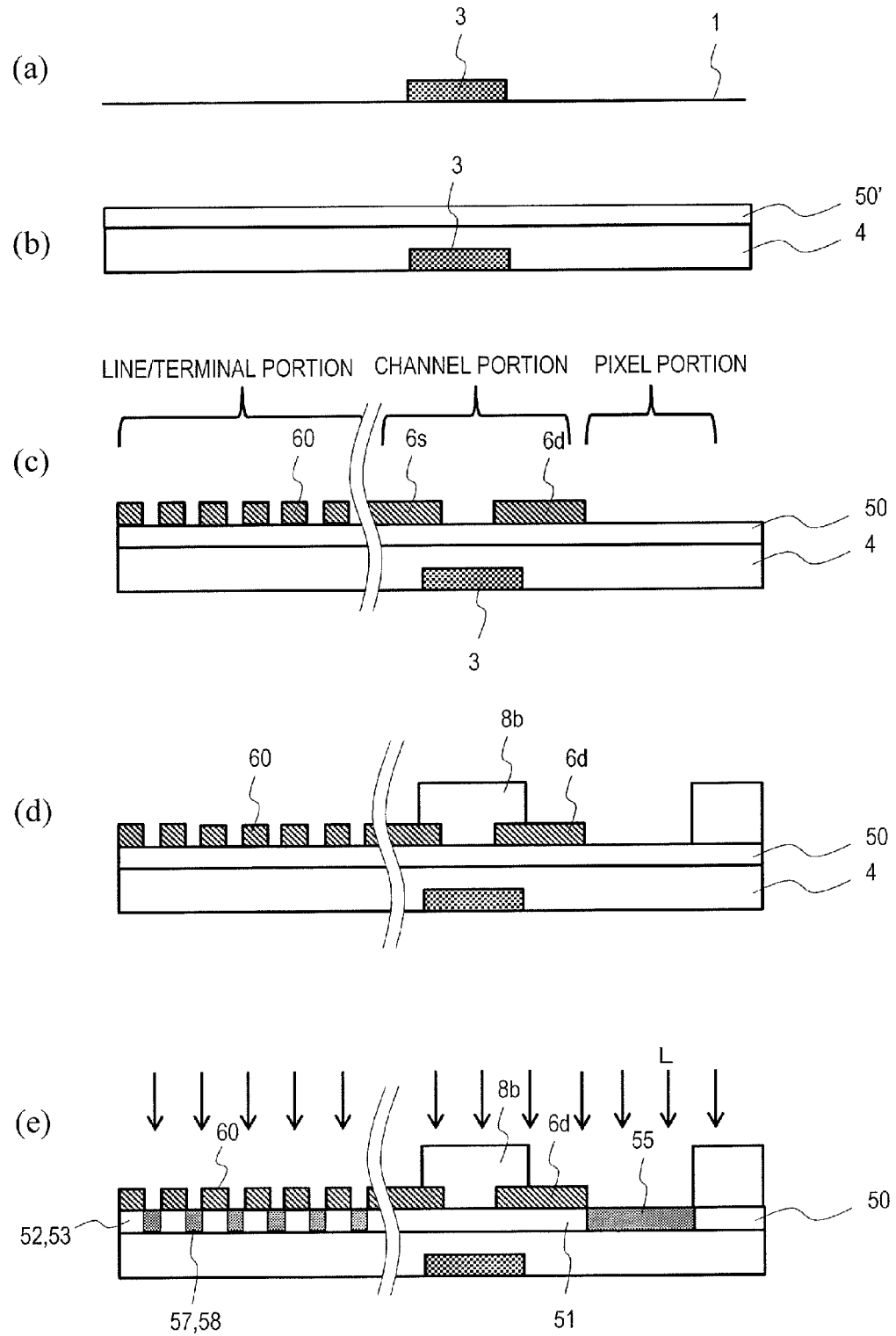
FIG. 4 (a) through (e) are schematic cross-sectional views illustrating respective manufacturing process steps to fabricate a TFT substrate 100 according to an embodiment of the present invention.
Figure 5:
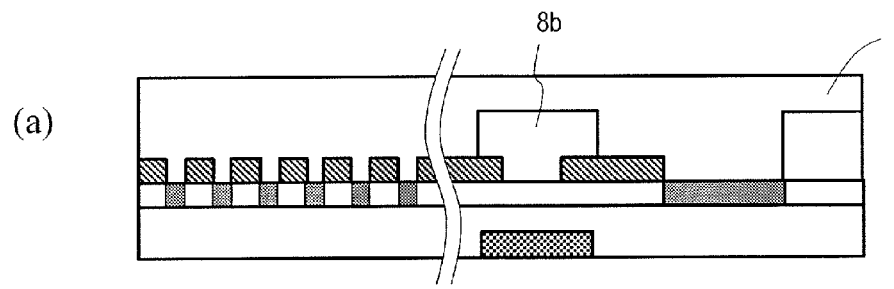
FIG. 5 (a) and (b) are schematic cross-sectional views illustrating respective manufacturing process steps to fabricate a TFT substrate 100 according to an embodiment of the present invention.
Figure 5:
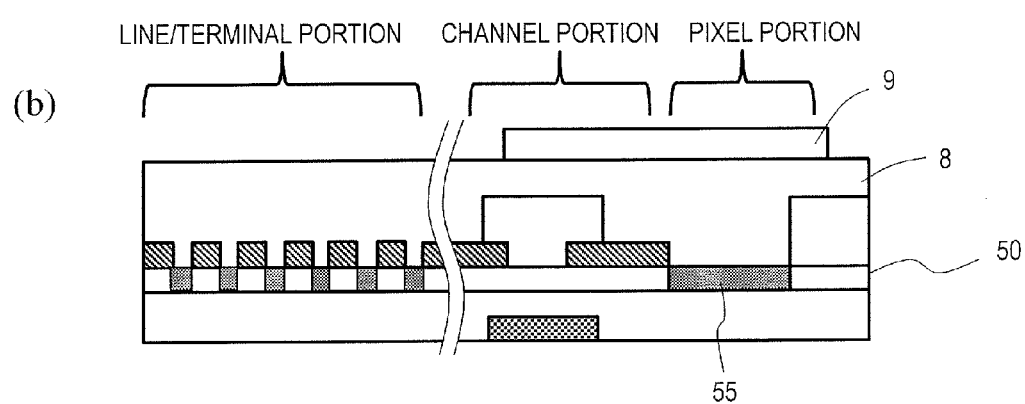

The TFT substrate 100A(1) may be fabricated by the same method as what has already been described with reference to FIGS. 4 and 5. In this embodiment, when an upper transparent electrode 9 is formed by patterning the transparent conductive film that has been formed over the upper insulating layer 8, the upper transparent electrode 9 is arranged so as to overlap at least partially with the lower transparent electrode (conductor region 55) with the upper insulating layer 8 interposed between them. The upper transparent electrode 9 is connected to a predetermined potential and may function as a common electrode.

Although not shown, by patterning the transparent conductive film, not only the common electrode but also an external connecting layer to be connected to an external line in the terminal portion can be formed as well. In addition, an extended line to be used when electrically connected to either a source metal layer formed out of the same conductive film as the source line (source bus line) or a gate metal layer formed out of the same conductive film as the gate line (gate bus line) may also be formed. As a result, a TFT substrate in which a driver circuit has been formed as an integral part can be fabricated, and a display device of high quality can be manufactured.

In the TFT substrate 100A(1), the semiconductor region 51 is arranged so as to overlap with the gate electrode 3 extended from the gate line 3' when viewed along a normal to the substrate 1. However, the TFT substrate 100A(1) may also be arranged so as to overlap with the gate line 3'.

Figure 10:
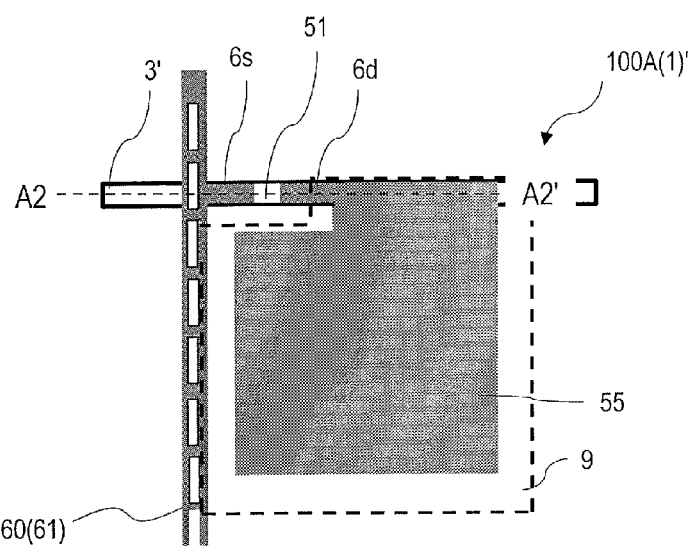
FIG. 10 (a) is a schematic plan view illustrating a TFT substrate 100A(1)' as a modified example of Embodiment A1. (b) is a schematic cross-sectional view of the TFT substrate 100A(1)' as viewed on the plane A2-A2' shown in (a).
Figure 10:
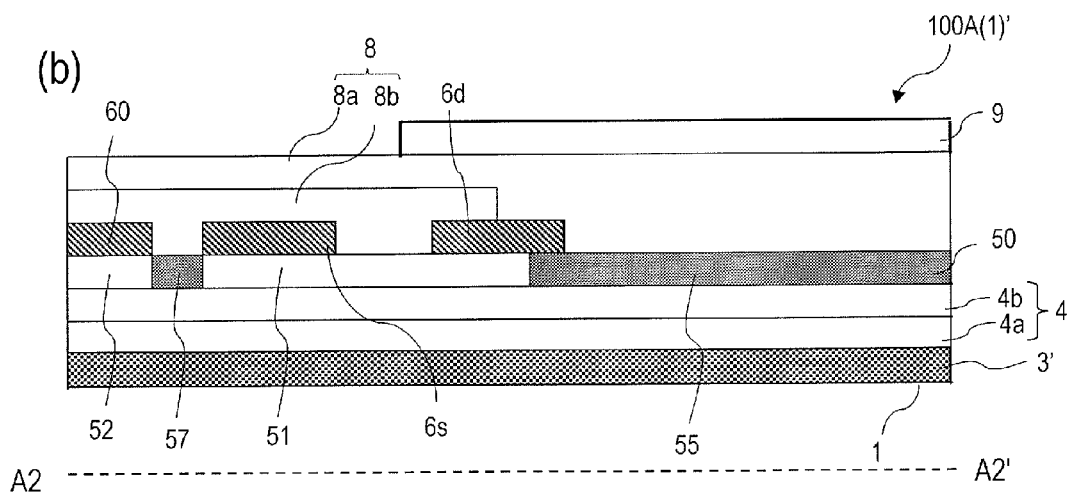

FIG. 10(a) is a schematic plan view illustrating a TFT substrate 100A(1)' as a modified example. FIG. 10(b) is a schematic cross-sectional view of the TFT substrate 100A(1)' as viewed on the plane A2-A2' shown in FIG. 10(a).

The TFT substrate 100A(1)' shown in FIGS. 10(a) and 10(b) includes a semiconductor region 51 over a gate line 3' and has a structure in which when viewed along a normal to the substrate 1, the gate line 3' and the source and drain electrodes 6s, 6d overlap with each other, which is a difference from the TFT substrate 100A(1). This TFT substrate 100A(1)' can have an even higher aperture ratio than the TFT substrate 100A(1).

However, this TFT substrate 100A(1)' has a higher gate-drain parasitic capacitance (Cgd) than the TFT substrate 100A(1), which is one of drawbacks of the TFT substrate 100A(1)'. As is well known, if the gate-drain parasitic capacitance (Cgd) is large, then the feedthrough voltage rises. The feedthrough voltage would cause an image persistence phenomenon or flickers. To lower the feedthrough voltage, the ratio of the gate-drain parasitic capacitance (Cgd) to the overall capacitance of the pixel (i.e., liquid crystal capacitance Clc+storage capacitance Cs+gate-drain parasitic capacitance Cgd) needs to be decreased. This TFT substrate 100A(1)' has a transparent storage capacitor with a transparent electrode, and therefore, can have its capacitance value increased by increasing the area of the storage capacitor without causing a decrease in aperture ratio. That is to say, even by adopting such a structure in which the gate-drain parasitic capacitance (Cgd) becomes as high as in this TFT substrate 100A(1)', the feedthrough voltage can be reduced sufficiently.

Moreover, if a pixel's overall capacitance is large, it means that a lot of electric charges are needed to apply a predetermined voltage to the pixel. This TFT substrate 100A(1)' includes oxide semiconductor TFTs which have higher current supplying ability than conventional amorphous silicon TFTs. That is why the display quality will never be debased by an increase in the pixel's capacitance.

(Embodiment A2)

Figure 11:
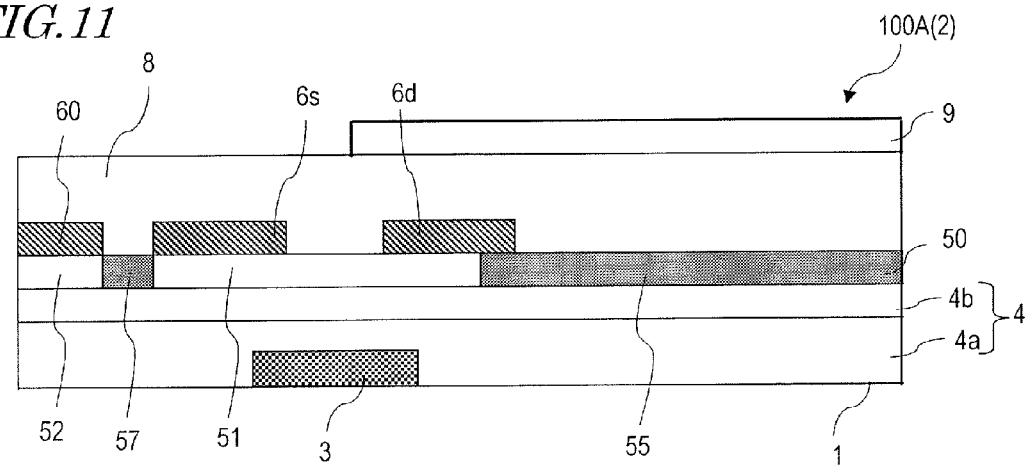
FIG. 11 A schematic cross-sectional view of the TFT substrate 100A(2) according to Embodiment A2 of the present invention.

Hereinafter, a TFT substrate 100A(2) will be described as Embodiment A2 with reference to FIG. 11, which is a schematic cross-sectional view of the TFT substrate 100A(2) and corresponds to the cross-sectional view of the TFT substrate 100A shown in FIG. 1(b). In FIG. 11, any component also included in the TFT substrate 100A and having substantially the same function as its counterpart is identified by the same reference numeral as its counterpart's and description thereof will be omitted herein to avoid redundancies.

This TFT substrate 100A(2) includes no insulating protective layer 8b and the upper insulating layer 8 is arranged to contact with the channel region, which is a difference from the TFT substrate 100A. Thus, in this TFT substrate 100A(2), the upper insulating layer 8 is suitably made of an insulating oxide (such as $SiO_2$) because it is possible to prevent the semiconductor characteristic of the semiconductor region 51 from deteriorating in that case, as described above.

Also, as will be described in detail later, in this TFT substrate 100A(2), a portion of the upper insulating layer 8 which is located over the conductor region 55 may be doped more heavily with a p-type dopant or an n-type dopant than everywhere else in some cases.

Figure 12:
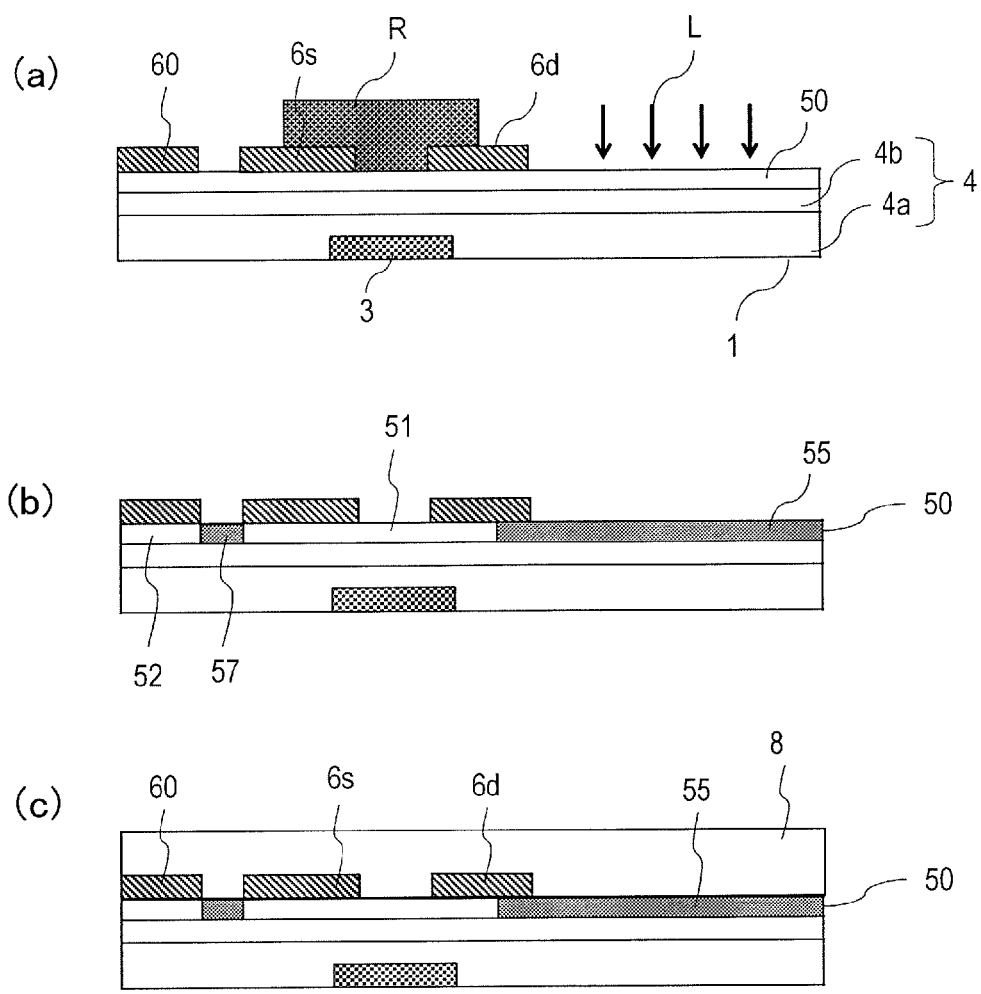
FIG. 12 (a) to (c) are schematic cross-sectional views illustrating respective manufacturing process steps to fabricate the TFT substrate 100A(2) of Embodiment A2.

Hereinafter, an exemplary method for fabricating this TFT substrate 100A(2) will be described with reference to FIG. 12. FIGS. 12(a) to 12(c) are schematic cross-sectional views illustrating respective manufacturing process steps to fabricate the TFT substrate 100A(2).

First, a gate electrode 3, a gate insulating layer 4, an oxide layer 50 and source and drain electrodes 6s, 6d are formed as described above on the substrate 1 (see FIGS. 4(a) to 4(c)).

Next, as shown in FIG. 12(a), a protective layer R (which will be sometimes referred to herein as a "resist mask layer") is formed by a known method so as to contact with the channel region of the oxide layer 50. The resist mask layer R may be made of a photosensitive resin, for example. Also, when viewed along a normal to the substrate 1, an end portion of the resist mask layer R closer to the channel suitably overlaps with the drain electrode 6d, because the conductor region 55 can be extended to the vicinity of the end portion of the drain electrode 6d in that case. Also, the resist mask layer R is arranged so as not to cover the holes or notches of the conductive layer 60.

Thereafter, a portion of oxide layer 50 is subjected to the resistance lowering process L by the method described above. As a result, a portion of the oxide layer 50 that is not covered with the source electrode 6s, drain electrode 6d or resist mask layer R has its resistance lowered to turn into a conductor region 55. In addition, other portions of the oxide layer 50 which are exposed inside the holes of the conductive layer 60 also have their resistance lowered to be conductor regions 57. Meanwhile, the rest of the oxide layer 50 that has not had its resistance lowered becomes semiconductor regions 51 and 52 (see FIG. 12(b)). After that, the resist mask layer R is removed by a known method. Subsequently, as shown in FIG. 12(c), an upper insulating layer 8 is formed by a known method. And then an upper transparent electrode (not shown) is formed on the upper insulating layer 8.

However, this is not the only method for fabricating the TFT substrate 100A(2). Alternatively, after an upper insulating layer 8 is formed over the oxide layer 50, the resistance lowering process may be carried out through the upper insulating layer 8 as will be described below. Still alternatively, after an upper insulating layer 8 and an upper transparent electrode 9 are formed over the oxide layer 50, the resistance lowering process may be carried out through the upper insulating layer 8 and the upper transparent electrode 9.

Hereinafter, another exemplary method for fabricating the TFT substrate 100A(2) will be described with reference to FIG. 13. FIGS. 13(a) to 13(c) are schematic cross-sectional views illustrating respective manufacturing process steps to fabricate the TFT substrate 100A(2).

First, a gate electrode 3, a gate insulating layer 4, an oxide layer 50, a source electrode 6s, a drain electrode 6d and a conductive layer 60 are formed as described above on the substrate 1 (see FIGS. 4(a) to 4(c)).

Next, as shown in FIG. 13(a), an upper insulating layer 8 is formed over the source and drain electrodes 6s, 6d and the oxide layer 50.

Next, as shown in FIG. 13(b), a resist mask layer R is formed on the upper insulating layer 8. The resist mask layer R is arranged to overlap with the channel region of the oxide layer 50 when viewed along a normal to the substrate 1. When viewed along a normal to the substrate 1, an end portion of the resist mask layer R suitably overlaps with the drain electrode 6d, because the conductor region 55 can be extended to the vicinity of the end portion of the drain electrode 6d in that case. Also, the resist mask layer R is arranged so as not to cover the holes or notches of the conductive layer 60 when viewed along a normal to the substrate 1.

Thereafter, portions of the oxide layer 50 are subjected to a resistance lowering process L. For example, a p-type dopant or an n-type dopant is introduced into the oxide layer 50 through the upper insulating layer 8. As a result, the portions of the oxide layer 50 doped with the dopant turn into conductor regions 55, 57, while the other undoped portions of the oxide layer 50 become semiconductor regions 51, 52 (see FIG. 13(c)). After that, the resist mask layer R is removed by a known method. Subsequently, although not shown, an upper transparent electrode is formed on the upper insulating layer 8.

Hereinafter, still another exemplary method for fabricating the TFT substrate 100A(2) will be described with reference to FIG. 14. FIGS. 14(a) to 14(c) are schematic cross-sectional views illustrating respective manufacturing process steps to fabricate the TFT substrate 100A(2).

First, a gate electrode 3, a gate insulating layer 4, an oxide layer 50, a source electrode 6s, a drain electrode 6d and a conductive layer 60 are formed as described above on the substrate 1 (see FIGS. 4(a) to 4(c)).

Next, as shown in FIG. 14(a), an upper insulating layer 8 is formed over the source electrode 6s and the oxide layer 50. Then, as shown in FIG. 14(b), an upper transparent electrode 9 is formed on the upper insulating layer 8 by the method described above.

Subsequently, as shown in FIG. 14(c), a resist mask layer R is formed on the upper insulating layer 8. The resist mask layer R is arranged to overlap with the channel region of the oxide layer 50 when viewed along a normal to the substrate 1. When viewed along a normal to the substrate 1, an end portion of the resist mask layer R suitably overlaps with the drain electrode 6d, because the conductor region can be extended to the vicinity of the end portion of the drain electrode 6d in that case. Also, the resist mask layer R is arranged so as not to cover the holes or notches of the conductive layer 60 when viewed along a normal to the substrate 1.

Thereafter, portions of the oxide layer 50 are subjected to a resistance lowering process L. As a result, although not shown, the portions of the oxide layer 50 that have had their resistance lowered turn into conductor regions 55, 57, while the rest of the oxide layer 50 that has not had its resistance lowered becomes semiconductor regions 51, 52. After that, the resist mask layer R is removed by a known method.

Figure 13:
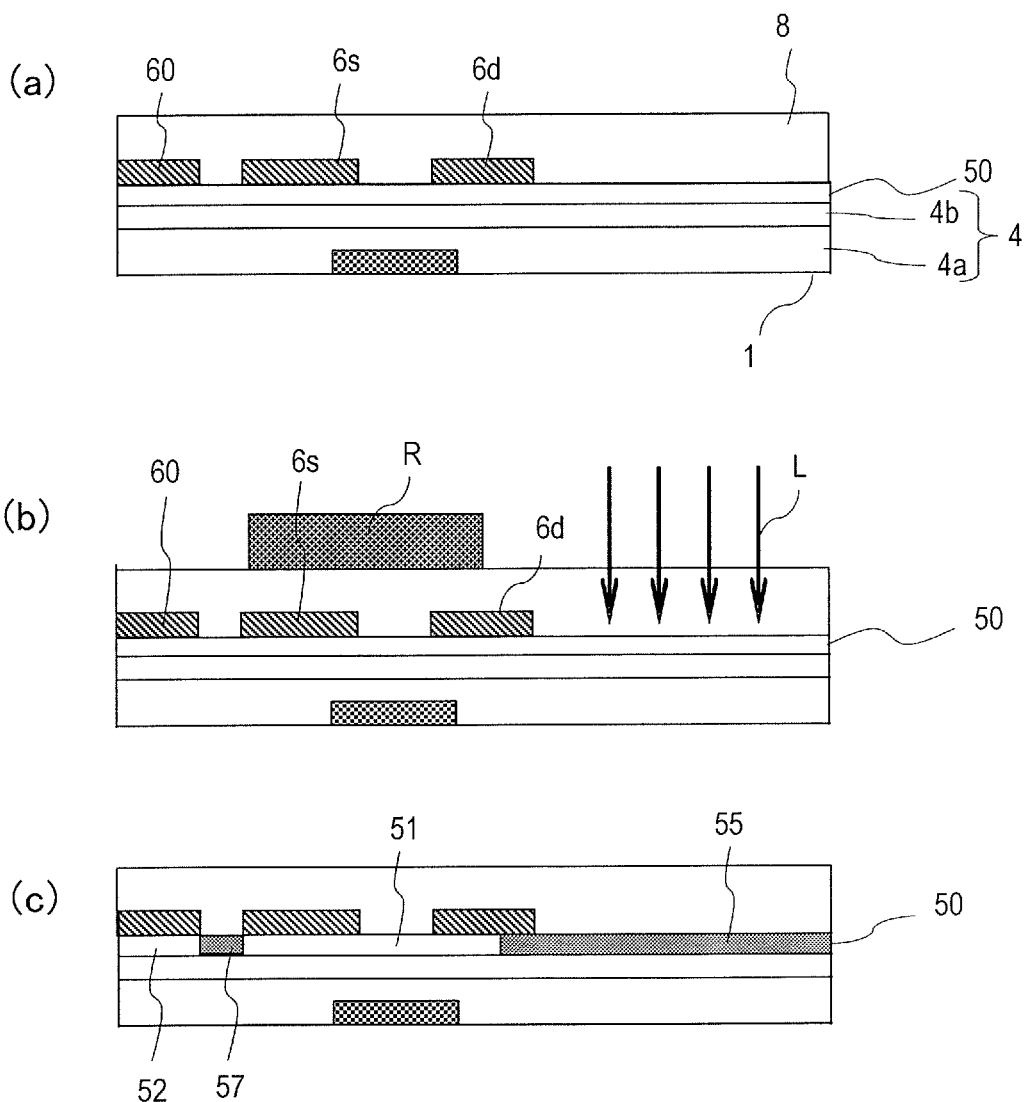
FIG. 13 (a) to (c) are schematic cross-sectional views illustrating another series of manufacturing process steps to fabricate the TFT substrate 100A(2).
Figure 14:
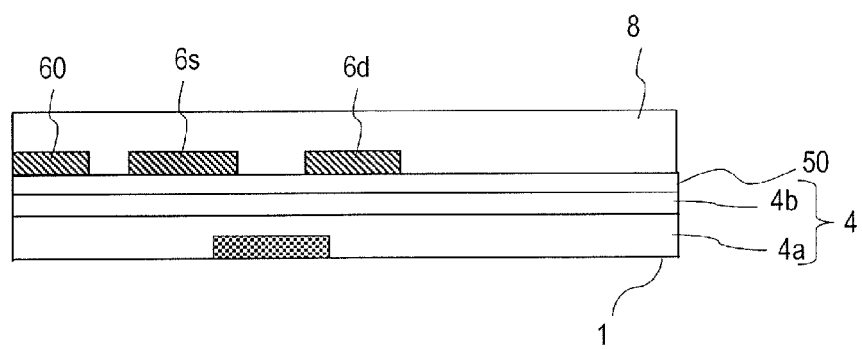
FIG. 14 (a) to (c) are schematic cross-sectional views illustrating still another series of manufacturing process steps to fabricate the TFT substrate 100A(2).
Figure 14:
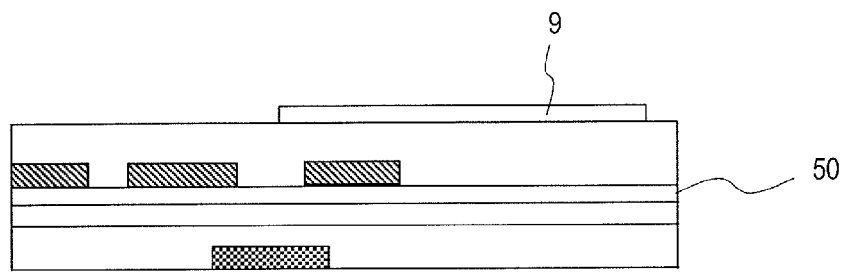
Figure 14:
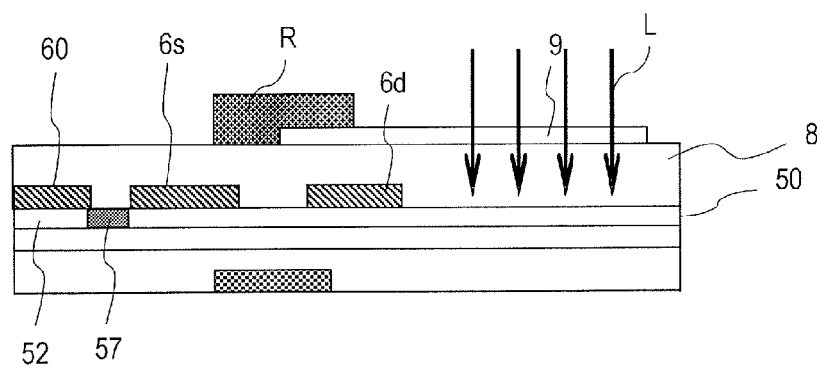

According to the manufacturing processes shown in FIGS. 13 and 14, the resistance lowering process L is carried out with the oxide layer 50 covered with the upper insulating layer 8. In that case, the portions of the upper insulating layer 8 that are located over the conductor regions 55 and 57 are doped more heavily with a p-type dopant or an n-type dopant than the portions that are located over the semiconductor regions 51 and 52.

(Embodiment B1)

Figure 15:
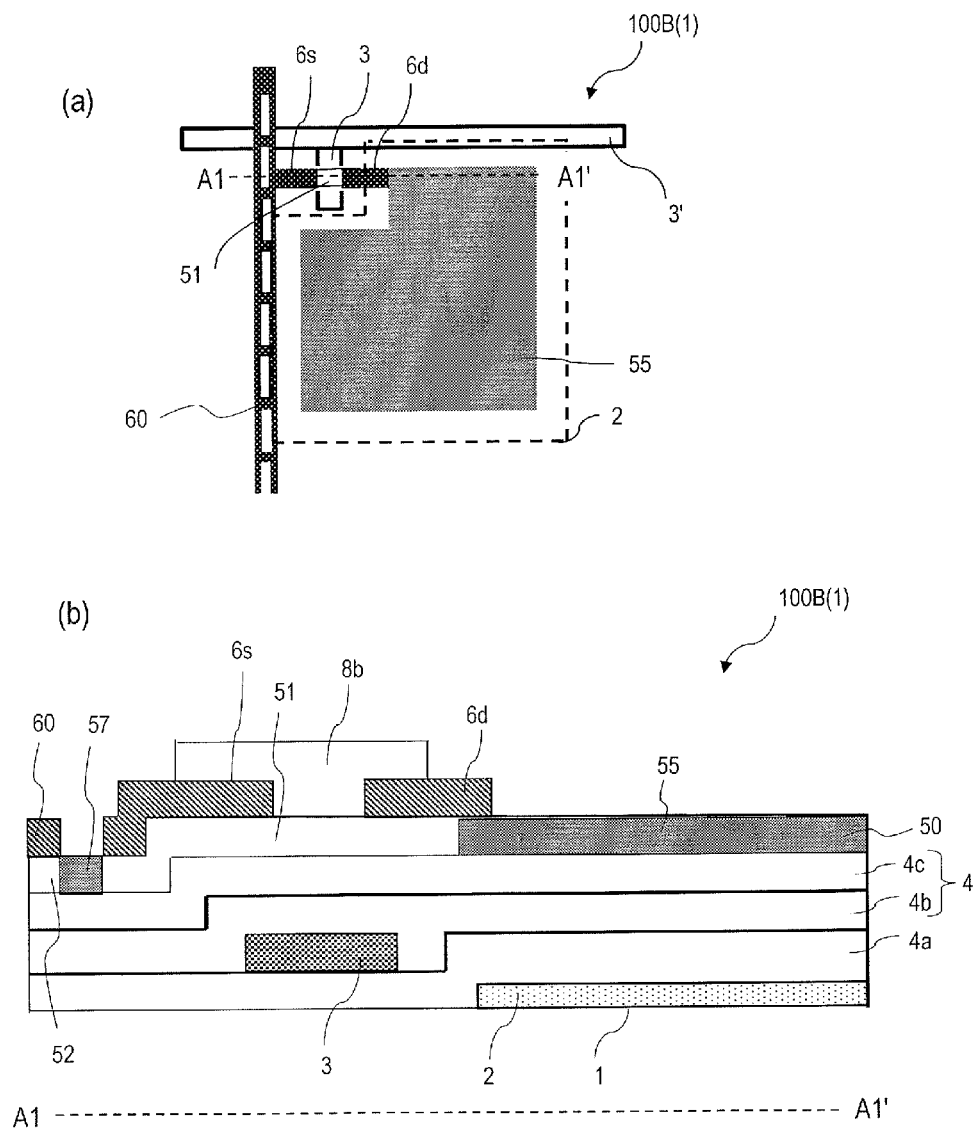
FIG. 15 (a) is a schematic plan view illustrating a TFT substrate 100B(1) according to Embodiment B1 of the present invention, and (b) is a schematic cross-sectional view as viewed on the plane A1-A1' shown in (a).

FIG. 15(a) is a schematic plan view illustrating a TFT substrate 100B(1) according to Embodiment B1, and FIG. 15(b) is a schematic cross-sectional view of the semiconductor device (TFT substrate) 100B as viewed on the plane A1-A1' shown in FIG. 15(a).

This TFT substrate 100B(1) includes a substrate 1, a gate electrode 3 and a lower transparent electrode 2 which are formed on the substrate 1, insulating layers 4b and 4c which are formed over the gate electrode 3 and the lower transparent electrode 2, and an oxide layer 50 which is formed over the insulating layers 4b and 4c. These insulating layers 4b and 4c function as a gate insulating layer 4. In this example, the insulating layer 4a is formed between the lower transparent electrode 2 and the gate electrode 3.

As in the embodiments described above, the oxide layer 50 also includes semiconductor regions 51, 52 and conductor regions 55, 57. On the oxide layer 50, source and drain electrodes 6s and 6d and a conductive layer 60 with a plurality of holes are formed. The oxide layer 50, source and drain electrodes 6s, 6d and the conductive layer 60 may have the same configurations as their counterparts of the embodiments described above.

In this embodiment, the lower transparent electrode overlaps at least partially with the conductor region 55 with an insulating layer (i.e., the insulating layers 4b and 4c in this example) interposed between them. The semiconductor region 51 overlaps at least partially with the gate electrode 3 with the gate insulating layer 4 interposed between them.

In this TFT substrate 100B(1), at least a part of the lower transparent electrode 2 overlaps with the conductor region 55 with the gate insulating layer 4 interposed between them, thus forming a storage capacitor between them. However, this TFT substrate's (100B(1)) storage capacitor is transparent (i.e., can transmit visible light), and does not decrease the aperture ratio. Consequently, this TFT substrate 100B(1) can have a higher aperture ratio than a conventional TFT substrate with a storage capacitor including a non-transparent electrode which is formed out of a metal film (such as a gate metal layer or a source metal layer). On top of that, since the aperture ratio is not decreased by the storage capacitor, the capacitance value of the storage capacitor (i.e., the area of the storage capacitor) can be increased as needed, which is also advantageous.

In this embodiment, the drain electrode 6d is suitably arranged on the conductor region 55 and the conductor region 55 is suitably in direct contact with the drain electrode 6d as in the embodiments described above.

In this TFT substrate 100B(1), the lower transparent electrode 2 is covered with the insulating layer 4a, on which the gate electrode 3 is formed. In addition, this TFT substrate 100B(1) further includes an insulating protective layer 8b which is formed on the source and drain electrodes 6s and 6d. The insulating protective layer 8b is formed to contact with the channel region of the semiconductor region 51. The insulating protective layer 8b may be made of an oxide, for example.

Next, the respective components of this TFT substrate 100B(1) will be described in detail.

The substrate 1, gate line layer (including the gate electrode 3 and the gate line 3'), gate insulating layer 4, oxide layer 50, source line layer (including the source electrode 6s, drain electrode 6d and source line), and insulating protective layer 8b may be made of the same materials and may have the same thicknesses as what has already been described for the embodiments.

In this embodiment, the gate insulating layer 4 has a double layer structure consisting of the lower insulating layer 4b and the upper insulating layer 4c. The insulating layer 4c contacts directly with the semiconductor region 51 of the oxide semiconductor layer 50. The insulating layer 4c suitably includes an oxide insulating layer. If one of the two layers of the gate insulating layer that directly contacts with the semiconductor region 51 includes an oxide insulating layer, oxygen included in the oxide insulating layer will be supplied to the semiconductor region 51, thus preventing oxygen deficiencies of the semiconductor region 51 from deteriorating the properties of the semiconductor.

In this embodiment, the insulating layer 4a may be an $SiN_x$ (silicon nitride) layer with a thickness of approximately 100 nm, for example. The insulating layers 4b and 4c may be an $SiN_x$ (silicon nitride) layer with a thickness of approximately 325 nm and an $SiO_2$ (silicon dioxide) layer with a thickness of approximately 50 nm, respectively. And the gate insulating layer 4 may have an overall thickness of approximately 375 nm, for example. Alternatively, these insulating layers 4a, 4b, and 4c may also be a single layer or a multilayer structure of $SiO_2$ (silicon dioxide), $SiN_x$ (silicon nitride), $SiO_xN_y$ (silicon oxynitride, where x>y), $SiN_xO_y$ (silicon nitride oxide, where x>y), $Al_2O_3$ (aluminum oxide), or tantalum oxide ($Ta_2O_5$).

The thickness of the gate insulating layer 4 suitably falls within the range of about 50 nm to about 600 nm. To prevent impurities from diffusing from the substrate 1, the insulating layers 4a and 4b are suitably made of $SiN_x$ or $SiN_xO_y$ (silicon oxynitride, where x>y). Moreover, to prevent the semiconductor properties of the semiconductor region 51 from deteriorating, the insulating layer 4c is suitably made of either $SiO_2$ or $SiO_xN_y$ (silicon nitride oxide, where x>y). Furthermore, to form a dense gate insulating layer 4 which causes little gate leakage current at low temperatures, the gate insulating layer 4 is suitably formed with a rare gas of Ar (argon), for example, supplied.

Figure 16:
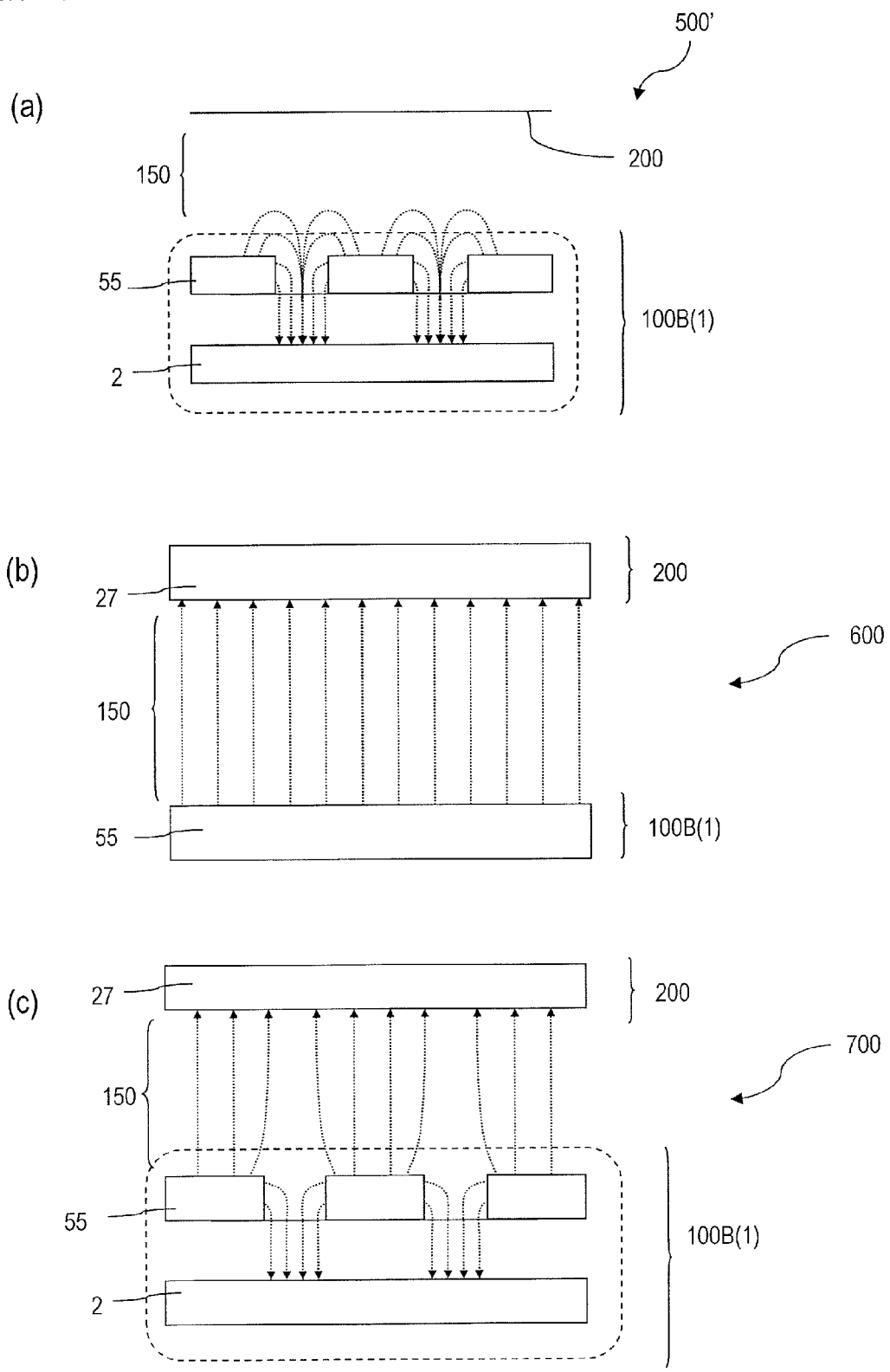
FIG. 16 (a) to (c) are schematic cross-sectional views illustrating display devices each including the TFT substrate 100B(1).

Hereinafter, a liquid crystal display device including such a TFT substrate 100B(1) will be described with reference to FIG. 16. Specifically, FIGS. 16(a) to 16(c) are schematic cross-sectional views of a liquid crystal display device including the TFT substrate 100B(1). In FIGS. 16(a) to 16(c), the dotted arrows indicate the directions of an electric field.

As shown in FIG. 16(a), the TFT substrate 100B(1) may be used in a Fringe Field Switching (FFS) mode liquid crystal display device 500', for example. In this case, the lower transparent electrode 2 is used as a common electrode (to which either a common voltage or a counter voltage is applied) and the conductor region 55 that forms the upper layer is used as a pixel electrode (to which a display signal voltage is applied). At least one slit is cut through the conductor region 55. A more detailed configuration and principle of display of an FFS mode liquid crystal display device have already been described with reference to FIG. 9(c), and description thereof will be omitted herein.

In this TFT substrate 100B(1), the lower transparent electrode (common electrode) 2 is located closer to the substrate 1 than the conductor region 55 that is the upper transparent electrode (pixel electrode). That is why this TFT substrate 100B(1) can be used in not only the FFS mode liquid crystal display device 500' but also liquid crystal display devices in any of various other liquid crystal modes as well.

For example, this TFT substrate 100B(1) may be used in a vertical electric field mode liquid crystal display device 600 as shown in FIG. 16(b) in which a counter electrode 27 is arranged on one surface of the counter substrate 200 to face the liquid crystal layer and which conducts a display operation by controlling the alignments of liquid crystal molecules in the liquid crystal layer 150 with a vertical electric field generated by the counter electrode 27 and the conductor region (pixel electrode) 55. In that case, a plurality of slits does not have to be cut through the conductor region 55.

Furthermore, the TFT substrate 100B(1) may also be used in a vertical/lateral electric field mode liquid crystal display device 700 as shown in FIG. 16(c) in which a counter electrode 27 is arranged on one surface of the counter substrate 200 to face the liquid crystal layer and a plurality of slits are cut through the conductor region (pixel electrode) 55 and which conducts a display operation by controlling the alignments of liquid crystal molecules in the liquid crystal layer 150 with a lateral electric field generated by the conductor region (pixel electrode) 55 and the lower transparent electrode (common electrode) 2 and with a vertical electric field generated by the conductor region (pixel electrode) 55 and the counter electrode 27. Such a liquid crystal display device 700 is disclosed in PCT International Application Publication No. 2012/053415, for example.

Consequently, this TFT substrate 100B(1) can be used in a larger number of liquid crystal display modes than a TFT substrate in which the pixel electrode is arranged closer to the substrate than the common electrode is.

Figure 17:
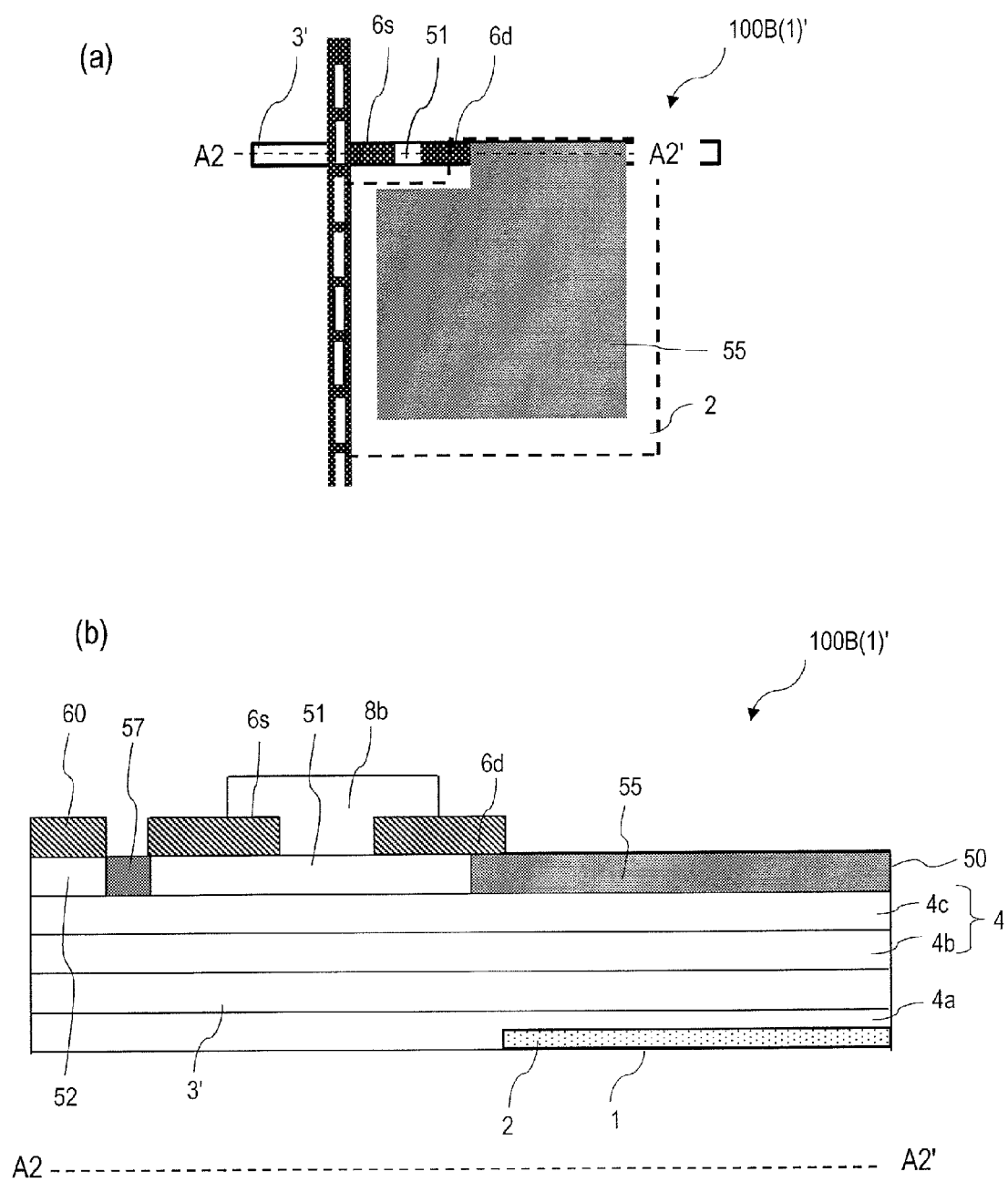
FIG. 17 (a) is a schematic plan view illustrating a TFT substrate 100B(1)' as a modified example of Embodiment B1. (b) is a schematic cross-sectional view of the TFT substrate 100B(1)' as viewed on the plane A2-A2' shown in (a).

The TFT substrate 100B(1) may be modified into the TFT substrate 100B(1)' shown in FIG. 17. FIG. 17(a) is a schematic plan view illustrating a TFT substrate 100B(1)' as a modified example. FIG. 17(b) is a schematic cross-sectional view of the TFT substrate 100B(1)' as viewed on the plane A2-A2' shown in FIG. 17(a).

The TFT substrate 100B(1)' shown in FIGS. 17(a) and 17(b) includes a semiconductor region 51 over a gate line 3' and has a structure in which when viewed along a normal to the substrate 1, the gate line 3' and the source and drain electrodes 6s, 6d overlap with each other, which is a difference from the TFT substrate 100B(1). In this case, that portion of the gate line 3' that overlaps with the semiconductor region 51 functions as a gate electrode. This TFT substrate 100B(1)' can have an even higher aperture ratio than the TFT substrate 1003(1).

This TFT substrate 1003(1)' has a higher gate-drain parasitic capacitance (Cgd) than the TFT substrate 1003(1), which is one of drawbacks of the TFT substrate 1003(1)'. However, as already described with reference to FIG. 10, even if such a structure that would increase the gate-drain parasitic capacitance (Cgd) is adopted, the feedthrough voltage can still be reduced sufficiently. In addition, the display quality will never be debased even if the pixel's capacitance increases.

Hereinafter, a method for fabricating the TFT substrate 100B(1) will be described.

FIGS. 18(a) through 18(f) are schematic cross-sectional views illustrating respective manufacturing process steps to fabricate the TFT substrate 100B(1).

First of all, as shown in FIG. 18(a), a lower transparent electrode 2 is formed on a substrate 1. As the substrate 1, a transparent insulating substrate such as a glass substrate, for example, may be used. The lower transparent electrode 2 may be formed by a known method such as a sputtering process. The lower transparent electrode 2 may be made of ITO, for example, and may have a thickness of about 100 nm.

Next, as shown in FIG. 18(b), an insulating layer 4a is deposited over the lower transparent electrode 2 by CVD process or any other suitable method. The insulating layer 4a may be made of $SiN_X$, for example, and may have a thickness of about 100 nm.

Subsequently, as shown in FIG. 18(c), a gate electrode 3 is formed on the insulating layer 4a. The gate electrode 3 may be formed by depositing a conductive film on the insulating layer 4a by sputtering process and then patterning the conductive film by photolithographic process. It should be noted that the gate electrode 3 is arranged so as not to overlap with the lower transparent electrode 2 when viewed along a normal to the substrate 1. In this example, a multilayer film with a double layer structure consisting of a TaN film (with a thickness of about 50 nm) and a W film (with a thickness of about 370 nm) that have been stacked one upon the other in this order on the substrate 1 is used as the conductive film. As this conductive film, a single-layer film of Ti, Mo, Ta, W, Cu, Al or Cr, a multilayer film or alloy film including any of these elements in combination, or a metal nitride film thereof may be used.

Next, as shown in FIG. 18(d), insulating layers 4b and 4c are deposited in this order by CVD process over the gate electrode 3. Subsequently, an oxide semiconductor film 50' is formed over the insulating layer 4c by sputtering process. In this example, an $SiN_X$ film (with a thickness of about 325 nm) is used as the insulating layer 4b and an $SiO_2$ film (with a thickness of about 50 nm) is used as the insulating layer 4c. And an In—Ga—Zn—O based semiconductor film (with a thickness of about 50 nm) is used as the oxide semiconductor film 50'.

Figure 18:
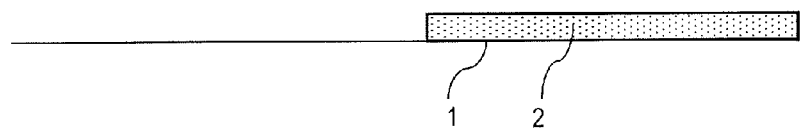
FIG. 18 (a) through (f) are schematic cross-sectional views illustrating respective manufacturing process steps to fabricate the TFT substrate 100B(1) of Embodiment B1.
Figure 18:
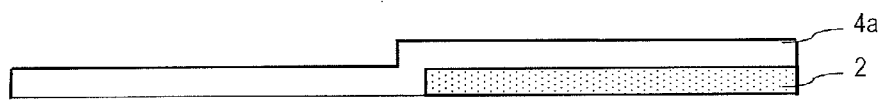
Figure 18:
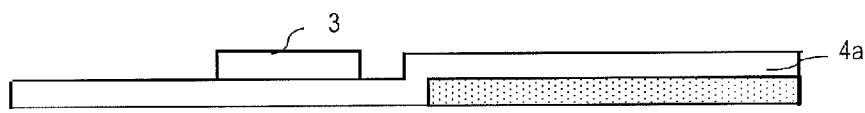
Figure 18:
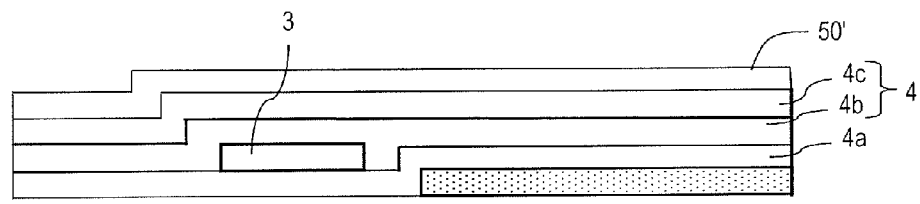
Figure 18:
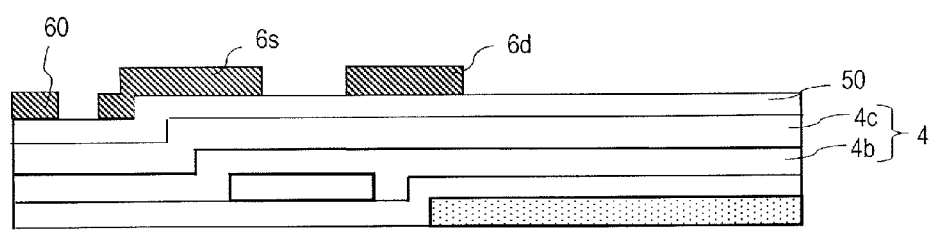
Figure 18:
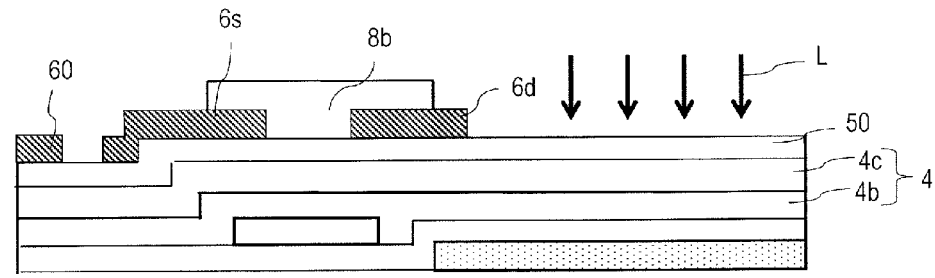

Thereafter, as shown in FIG. 18(*e*), a conductive film (not shown) to be a source electrode 6*s*, a drain electrode 6*d*, and a conductive layer 60 is formed by sputtering process over the oxide semiconductor film 50'. The conductive film may have a multilayer structure consisting of Ti, Al and Ti layers, for example. The lower Ti layer may have a thickness of about 50 nm, the Al layer may have a thickness of about 200 nm, and the upper Ti layer may have a thickness of about 100 nm.

Next, the conductive film and the oxide semiconductor film 50' are patterned simultaneously by performing a photolithographic process using a half-tone mask, a dry etching process and an ashing process. In this manner, the oxide semiconductor film 50' is patterned into an intended shape to form an oxide layer 50, and a source electrode 6*s*, a drain electrode 6*d* and a conductive layer 60 with a plurality of holes or notches are obtained.

Subsequently, as shown in FIG. 18(*f*), an insulating protective layer 8*b* is formed by sputtering and photolithographic processes so as to cover the channel region of the oxide layer 50. The insulating protective layer 8*b* may be made of an oxide (such as SiO$_2$), for example, and may have a thickness of about 150 nm. Also, when viewed along a normal to the substrate 1, an end portion of the insulating protective layer 8*b* suitably overlaps with the drain electrode 6*d*. Then, a portion of the oxide layer 50 which is located under the end portion of the drain electrode 6*d* can also be subjected to the resistance lowering process L to be described later.

Thereafter, although not shown, portions of the oxide layer 50 are subjected to a resistance lowering process L, thereby defining conductor regions 55 and 57. Specifically, portions of the oxide layer 50 which are not covered with any of the source electrode 6*s*, drain electrode 6*d*, insulating protective layer 8*b* and conductive layer 60 have their resistance lowered to be conductor regions 55. In the same way, portions of the oxide layer 50 which are exposed inside the holes or notches of the conductive layer 60 also have their resistance lowered to be conductor regions 57. The rest of the oxide layer 50 which has not had its resistance lowered is left as semiconductor regions 51 and 52. The electrical resistance of those portions that have been subjected to this resistance lowering process L (which will be referred to herein as "low-resistance portions") is lower than that of the other portions that have not been subjected to the resistance lowering process L (which will be referred to herein as "high resistance portions"). As the resistance lowering process L, the same processing method as what has already been described as an example with reference to FIG. 4(*e*) may be used in this embodiment, too.

(Embodiment B2)

Figure 19:
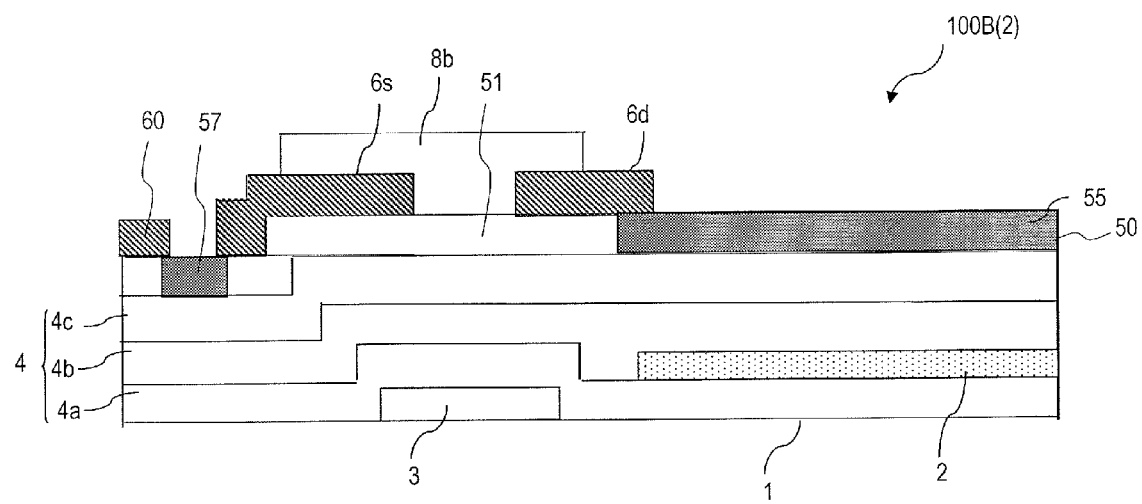
FIG. 19 A schematic cross-sectional view of a TFT substrate 100B(2) according to Embodiment B2 of the present invention.

Next, a TFT substrate 100B(2) as another embodiment of the present invention will be described with reference to FIG. 19, which is a schematic cross-sectional view of the TFT substrate 100B(2). The plan view of the TFT substrate 100B(2) may be the same as the one illustrated in FIG. 15(*a*), and is omitted herein. FIG. 19 illustrates a cross section as viewed on the plane A1-A1' shown in FIG. 15(*a*). In FIG. 19, any component also included in the TFT substrate 100B(1) and having substantially the same function as its counterpart is identified by the same reference numeral as its counterpart's and description thereof will be omitted herein to avoid redundancies.

In this TFT substrate 100B(2), the gate electrode 3 is located closer to the substrate than the lower transparent electrode 2 is, which is a difference from the TFT substrate 100B(1) described above. In this embodiment, the gate electrode 3 is covered with the insulating layer 4*a*, on which the lower transparent electrode 2 is arranged. In this TFT substrate 100B(2), these three insulating layers 4*a*, 4*b* and 4*c* function as a gate insulating layer 4.

Figure 20:
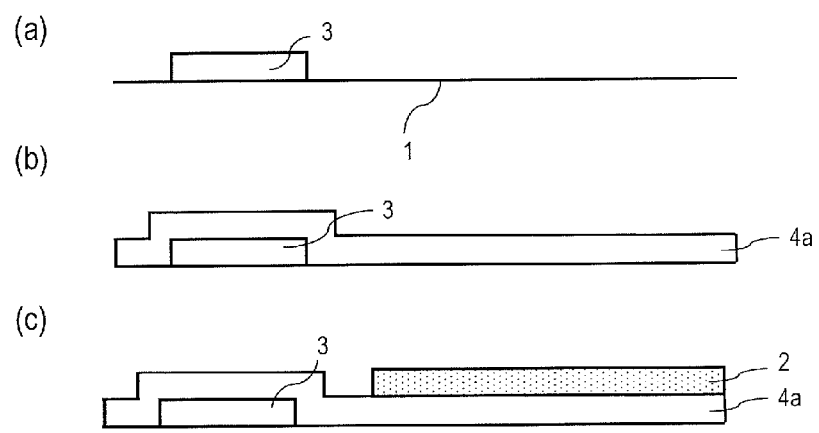
FIG. 20 (a) to (c) are schematic cross-sectional views illustrating respective manufacturing process steps to fabricate the TFT substrate 100B(2) of Embodiment B2.

Next, it will be described with reference to FIG. 20 how the TFT substrate 100B(2) may be fabricated. FIGS. 20(*a*) to 20(*c*) are schematic cross-sectional views illustrating respective manufacturing process steps to fabricate the TFT substrate 100B(2).

First of all, as shown in FIG. 20(*a*), a gate electrode 3 is formed on a substrate 1. Next, as shown in FIG. 20(*b*), an insulating layer 4*a* is formed to cover the gate electrode 3. Then, as shown in FIG. 20(*c*), a lower transparent electrode 2 is formed on the insulating layer 4*a*. It should be noted that the gate electrode 3 and the lower transparent electrode 2 do not overlap with each other when viewed along a normal to the substrate 1. After that, the same process steps as the ones that have already been described with reference to FIGS. 18(*d*) through 18(*f*) will be performed.

(Embodiment C1)

Figure 21:
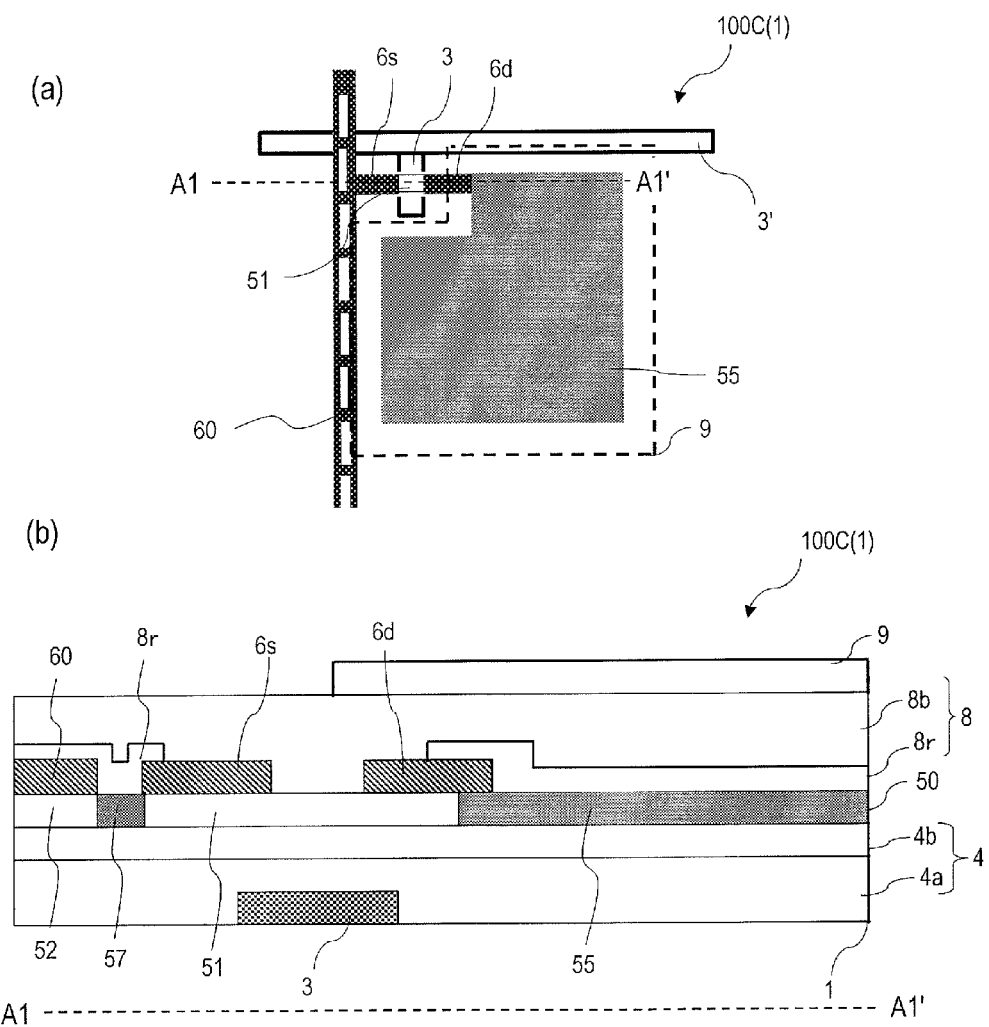
FIG. 21 (*a*) is a schematic plan view illustrating a TFT substrate 100C(1) according to Embodiment C1 of the present invention, and (*b*) is a schematic cross-sectional view as viewed on the plane A1-A1' shown in (*a*).

FIG. 21(*a*) is a schematic plan view illustrating a TFT substrate 100C(1) as another embodiment, and FIG. 21(*b*) is a schematic cross-sectional view of the semiconductor device (TFT substrate) 100A as viewed on the plane A1-A1' shown in FIG. 21(*a*).

In this embodiment, the TFT substrate further includes a reducing insulating layer 8*r* having the property of reducing the oxide semiconductor included in the semiconductor region 51 of the oxide layer 50. The reducing insulating layer 8*r* contacts with at least one of the upper and lower surfaces of the conductor regions 55 and 57 of the oxide layer 50, but does not contact with the semiconductor regions 51 and 52. In the other respects, this embodiment has the same configuration as Embodiment A1.

In the TFT substrate 100C(1) shown in FIG. 21, the upper insulating layer 8 is comprised of the reducing insulating layer 8*r* and an insulating protective layer 8*b*. The reducing insulating layer 8*r* is in contact with the upper surface of the conductor regions 55 and 57 of the oxide layer 50, and the insulating protective layer 8*b* is in contact with the upper surface of the semiconductor regions 51 and 52.

As will be described in detail later, when in contact with an oxide semiconductor film, the reducing insulating layer 8*r* has the function of lowering its electrical resistance. Thus, by using the reducing insulating layer 8*r*, a portion of the oxide layer 50 can turn into a conductor. That is why according to this embodiment, there is no need to carry out the resistance lowering process L such as plasma processing or dopant doping unlike the embodiments described above, and therefore, the manufacturing process can be further simplified.

It should be noted that although the resistance lowering process L involving a heat treatment is not carried out according to this embodiment, the conductive layer 60 could still peel as a result of a heat treatment to be carried out for a different purpose. Also, even if no heat treatment is carried out, the film peeling problem could still arise when the closeness of contact between the oxide layer 50 and the conductive layer 60 (which may be a metal layer) is lower than the closeness of contact between the oxide layer 50 and another layer (such as an insulating layer). That is why by applying the configuration in which a number of holes are cut through the conductive layer 60, the effect of preventing the conductive layer 60 from peeling can also be achieved as in the embodiments described above.

Next, a reducing insulating layer 8*r* according to this embodiment will be described with reference to FIG. 22.

The reducing insulating layer 8*r* has the function of lowering the electrical resistance of an oxide semiconductor layer when contacting with the oxide semiconductor layer. FIG.

22(*a*) is a graph showing a gate voltage (Vg)-drain current (Id) curve of an oxide semiconductor TFT having a configuration in which an oxide insulating layer (of $SiO_2$, for example) is formed so as to contact with the entire lower surface of an oxide semiconductor layer (active layer). On the other hand, FIG. 22(*b*) is a graph showing a gate voltage (Vg)-drain current (Id) curve of an oxide semiconductor TFT having a configuration in which a reducing insulating layer (of $SiN_x$, for example) is formed so as to contact with the entire lower surface of an oxide semiconductor layer (active layer).

Figure 22:
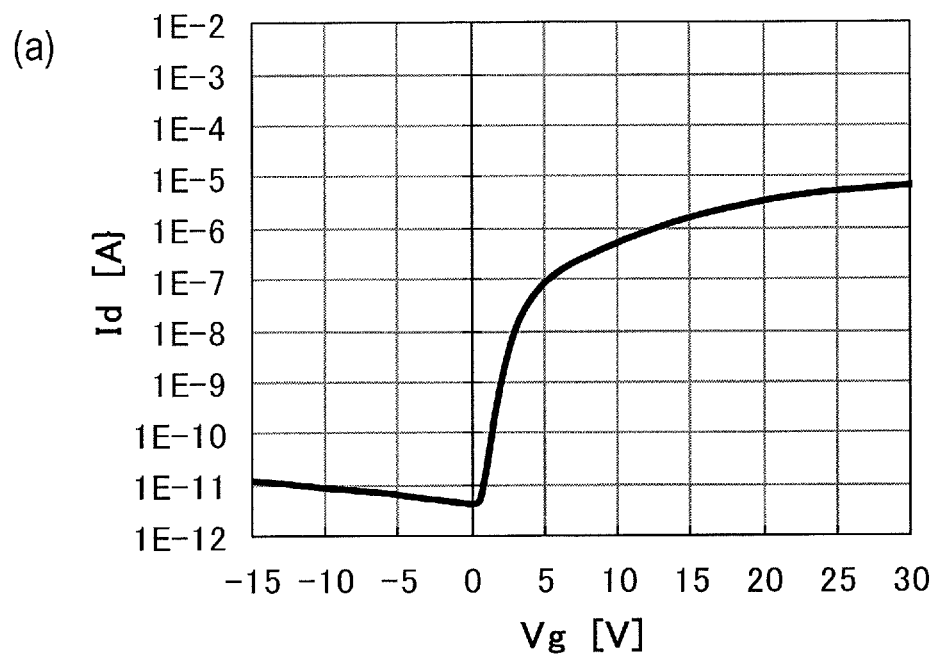
FIG. 22 (*a*) is a graph showing a gate voltage-drain current curve of an oxide semiconductor TFT having a configuration in which an oxide insulating layer is formed to contact with an oxide semiconductor layer. (*b*) is a graph showing a gate voltage-drain current curve of an oxide semiconductor TFT having a configuration in which a reducing insulating layer is formed to contact with an oxide semiconductor layer.
Figure 22:
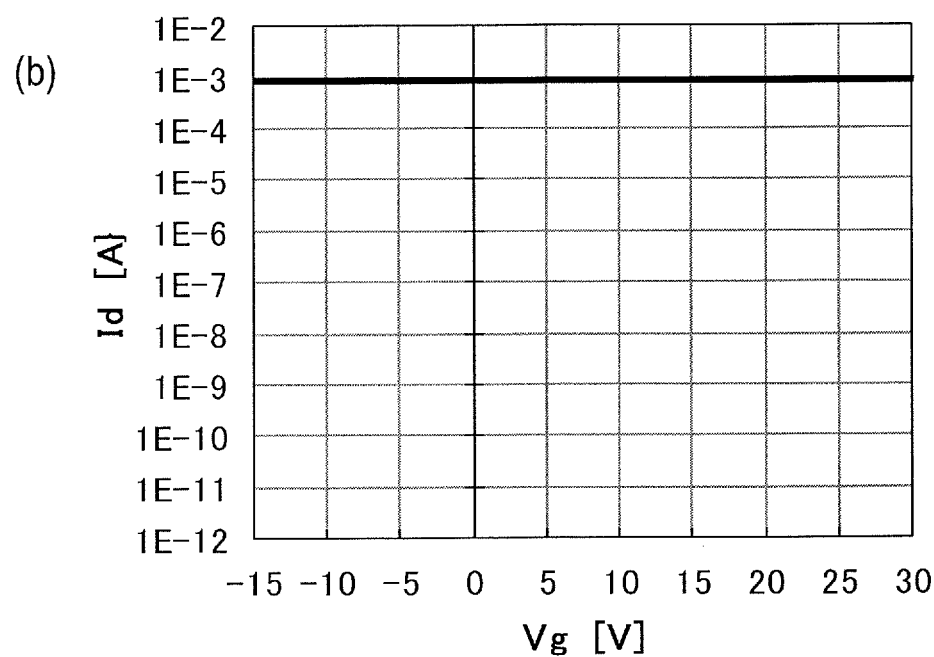

As can be seen from FIG. 22(*a*), an oxide semiconductor TFT in which an oxide insulating layer contacts directly with an oxide semiconductor layer has a good TFT characteristic.

On the other hand, as can be seen from FIG. 22(*b*), an oxide semiconductor TFT in which a reducing insulating layer contacts directly with an oxide semiconductor layer does not have a TFT characteristic, and the oxide semiconductor layer is turned into a conductor by the reducing insulating layer. This is probably because the reducing insulating layer will include a lot of hydrogen and will reduce the oxide semiconductor and lower the resistance of the oxide semiconductor layer by contacting with the oxide semiconductor layer.

The results shown in FIG. 22 reveal that if the reducing insulating layer 8*r* is arranged so as to contact with the oxide semiconductor layer, a portion of the oxide semiconductor layer which contacts with the reducing insulating layer 8*r* will be a low-resistance region with a lower electrical resistance than the other portion and will no longer function as an active layer. That is why if such a reducing insulating layer 8*r* is formed so as to directly contact with only a portion of the oxide layer (oxide semiconductor layer) 50, the oxide layer 50 can have its resistance lowered locally and the conductor regions 55 and 57 can be obtained. As a result, according to this embodiment, there is no need to perform any special resistance lowering process (such as a hydrogen plasma treatment) any longer, and the manufacturing process can be further simplified.

The reducing insulating layer 8*r* may be made of $SiN_x$, for example. The reducing insulating layer 8*r* may be formed at a substrate temperature of about 100° C. to about 250° C. (e.g., at 220° C.) and with the flow rates of $SiH_4$ and $NH_3$ gases adjusted so that the flow rate ratio (in sccm) of an $SiH_4$ and $NH_3$ mixed gas (i.e., the ratio of the flow rate of $SiH_4$ to the flow rate of $NH_3$) falls within the range of 4 to 20. The thickness of the reducing insulating layer 8*r* suitably falls within the range of about 50 nm to about 300 nm. In this embodiment, the reducing insulating layer 8*r* may have a thickness of about 100 nm, for example.

In this embodiment, the insulating protective layer 8*b* is arranged to contact with the channel region of the semiconductor region 51. The insulating protective layer 8*b* is suitably made of an insulating oxide (such as $SiO_2$). If the insulating protective layer 8*b* is made of an insulating oxide, it is possible to prevent the oxygen deficiencies in the semiconductor region 51 from deteriorating the semiconductor properties. Alternatively, the insulating protective layer 8*b* may also be made of SiON (which may be either silicon oxynitride or silicon nitride oxide), $Al_2O_3$ or $Ta_2O_5$, for example. The insulating protective layer 8*b* may have a thickness of about 265 nm, for example. The thickness of the insulating protective layer 8*b* suitably falls within the range of about 50 nm to about 300 nm, for example.

In this TFT substrate 100C(1), at least a part of the upper transparent electrode 9 overlaps with the conductor region 55 with the upper insulating layer 8 interposed between them as in Embodiment A1, and the aperture ratio can be high. In addition, the drain electrode 6*d* is suitably arranged to contact with the upper surface of the conductor region 55.

In this embodiment, the substrate 1, gate line layer (including the gate electrode 3 and the gate line 3'), gate insulating layer 4, oxide layer 50, source line layer (including the source electrode 6*s*, drain electrode 6*d* and source line), and upper transparent electrode 9 may be made of the same materials and may have the same thicknesses as what has already been described for the embodiments.

Figure 9:
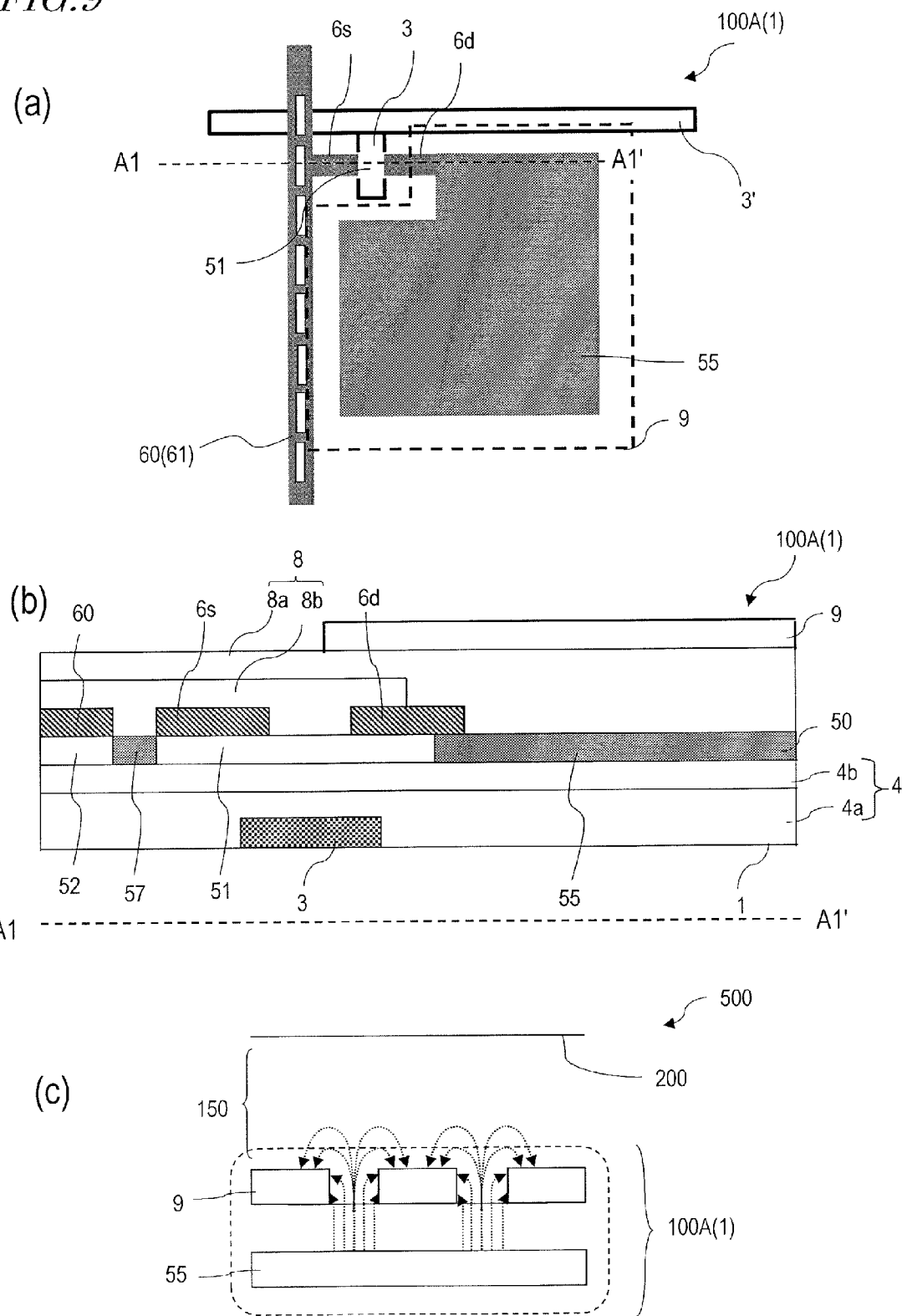
FIG. 9 (a) is a schematic plan view illustrating a TFT substrate 100A(1) according to Embodiment A1 of the present invention. (b) is a schematic cross-sectional view of the TFT substrate 100A as viewed on the plane A1-A1' shown in (a). And (c) is a schematic cross-sectional view of a liquid crystal display device 500 including the TFT substrate 100A(1).

This TFT substrate 100C(1) may be used in the FFS mode liquid crystal display device 500 shown in FIG. 9(*c*), for example. In this case, the conductor region 57 may be used as a pixel electrode to which a display signal voltage is applied, and the upper transparent electrode 9 may be used as a common electrode to which either a common voltage or a counter voltage is applied. At least one slit is cut through the upper transparent electrode 9.

Figure 23:
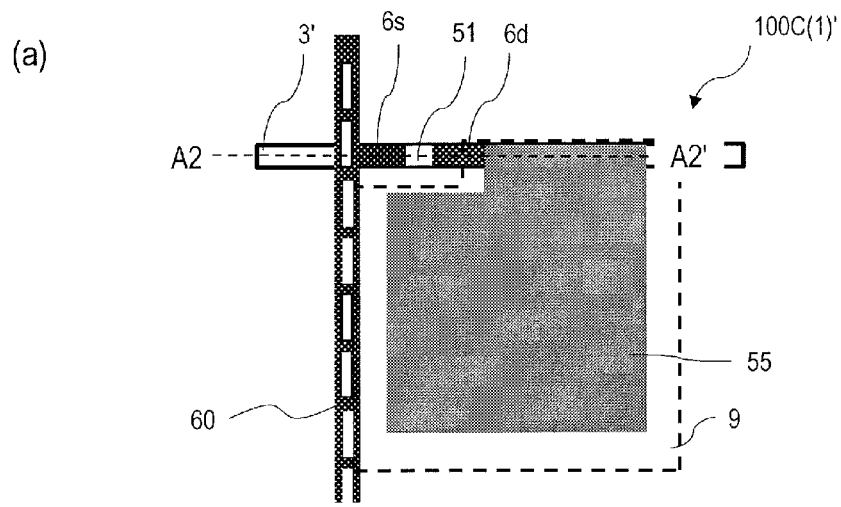
FIG. 23 (*a*) is a schematic plan view illustrating a TFT substrate 100C(1)' as a modified example of Embodiment C1. (*b*) is a schematic cross-sectional view of the TFT substrate 100C(1)' as viewed on the plane A2-A2' shown in (*a*).
Figure 23:
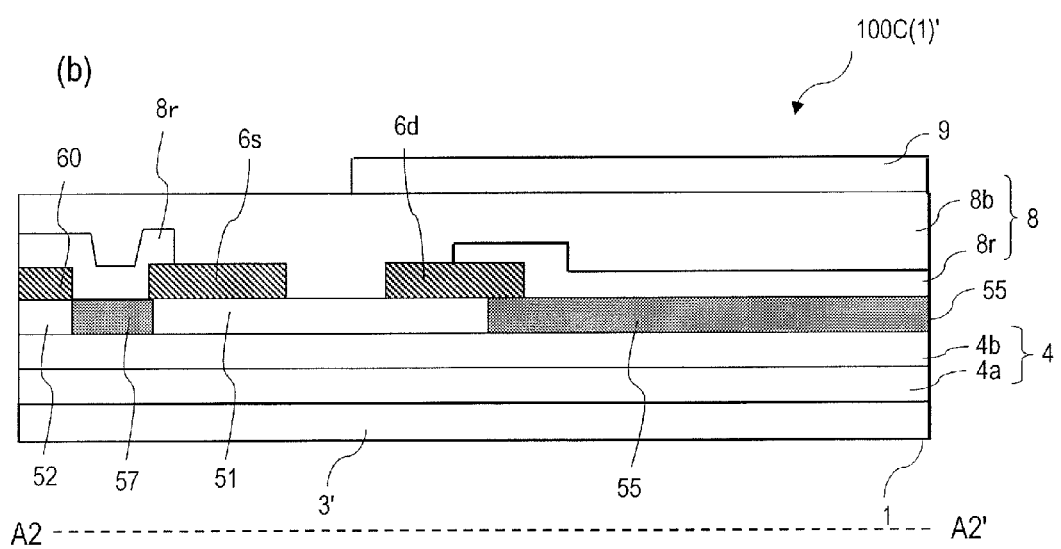

This TFT substrate 100C(1) may be modified into the TFT substrate 100C(1)' shown in FIG. 23. FIG. 23(*a*) is a schematic plan view illustrating a TFT substrate 100C(1)' as a modified example. FIG. 23(*b*) is a schematic cross-sectional view of the TFT substrate 100C(1)' as viewed on the plane A2-A2' shown in FIG. 23(*a*).

The TFT substrate 100C(1)' shown in FIGS. 23(*a*) and 23(*b*) includes a semiconductor region 51 over a gate line 3' and has a structure in which when viewed along a normal to the substrate 1, the gate line 3' and the source and drain electrodes 6*s*, 6*d* overlap with each other, which is a difference from the TFT substrate 100C(1). In this TFT substrate 100C(1)', the gate line 3' functions as a gate electrode 3. This TFT substrate 100C(1)' can have an even higher aperture ratio than the TFT substrate 100C(1).

This TFT substrate 100C(1)' has a higher gate-drain parasitic capacitance (Cgd) than the TFT substrate 100C(1) but can reduce the feedthrough voltage sufficiently. The reason is that this TFT substrate 100C(1)' has a transparent storage capacitor with a transparent electrode, and therefore, can have its capacitance value increased by increasing the area of the storage capacitor without causing a decrease in aperture ratio, as already described with reference to FIG. 10. Moreover, this TFT substrate 100C(1)' includes oxide semiconductor TFTs which have higher current supplying ability than conventional amorphous silicon TFTs. That is why the display quality will never be debased by an increase in the pixel's capacitance.

Hereinafter, an exemplary method for fabricating the TFT substrate 100C(1) will be described.

Figure 24:
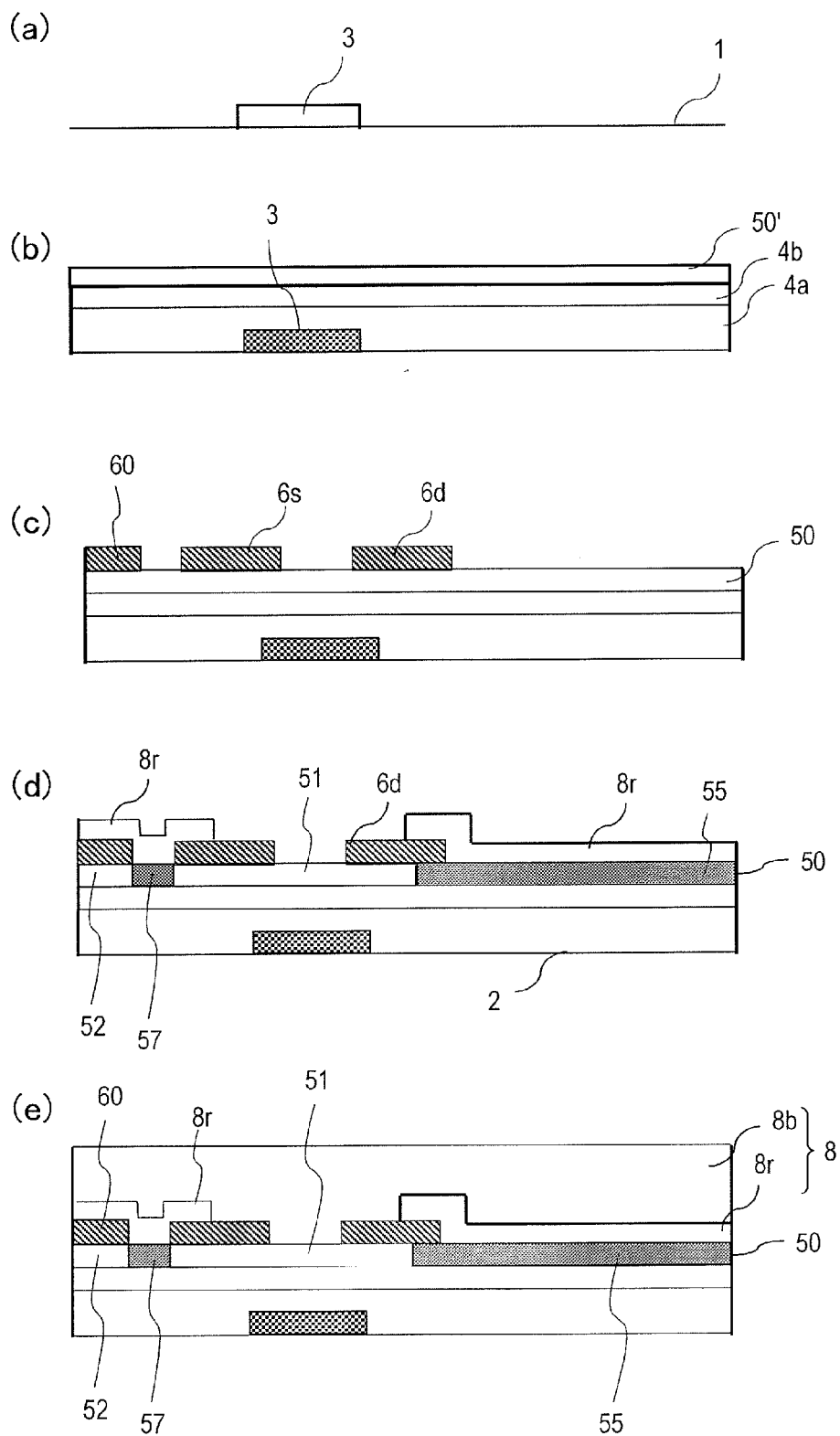
FIG. 24 (*a*) through (*e*) are schematic cross-sectional views illustrating respective manufacturing process steps to fabricate the TFT substrate 100C(1) of Embodiment C1.

FIGS. 24(*a*) through 24(*e*) are schematic cross-sectional views illustrating an exemplary series of manufacturing process steps to fabricate the TFT substrate 100C(1).

First of all, as shown in FIG. 24(*a*), a gate electrode 3 is formed on a substrate 1. As the substrate 1, a transparent insulating substrate such as a glass substrate, for example, may be used. The gate electrode 3 may be formed by depositing a conductive film on the substrate 1 by sputtering process and then patterning the conductive film by photolithographic process. In this example, a multilayer film with a double layer structure consisting of a TaN film (with a thickness of about 50 nm) and a W film (with a thickness of about 370 nm) that have been stacked one upon the other in this order on the substrate 1 is used as the conductive film. As this conductive film, a single-layer film of Ti, Mo, Ta, W, Cu, Al or Cr, a multilayer film or alloy film including any of these elements in combination, or a metal nitride film thereof may also be used.

Next, as shown in FIG. 24(*b*), insulating layers 4*a* and 4*b* are deposited in this order by CVD process over the gate electrode 3. Subsequently, an oxide semiconductor film 50' is formed over the insulating layer 4b by sputtering process.

In this example, the insulating layer 4a may be an $SiN_x$ film (with a thickness of about 325 nm) and the insulating layer 4b may be an $SiO_2$ film (with a thickness of about 50 nm). Alternatively, the insulating layer 4b may also be made of $SiO_2$, $SiO_xN_y$ (silicon oxynitride, where x>y), $SiN_xO_y$ (silicon nitride oxide, where x>y), $Al_2O_3$, or $Ta_2O_5$, for example. The insulating layer 4a may also be made of $SiN_x$, $SiO_2$, $SiO_xN_y$ (silicon oxynitride, where x>y), $SiN_xO_y$ (silicon nitride oxide, where x>y), $Al_2O_3$, or $Ta_2O_5$, for example. And an In—Ga—Zn—O based semiconductor film is used as the oxide semiconductor film 50', which may have a thickness of about 50 nm.

Thereafter, as shown in FIG. 24(c), a source electrode 6s, a drain electrode 6d, and a conductive layer 60 are formed by sputtering process over the oxide semiconductor film 50', and the oxide semiconductor film 50' is patterned, thereby obtaining an oxide layer 50.

Specifically, first of all, a conductive film (not shown) to be a source line layer is formed over the oxide semiconductor film 50'. Next, the conductive film and the oxide semiconductor film 50' are patterned simultaneously by photolithographic process using a half-tone mask, dry etching process and ashing process, thereby turning the oxide semiconductor film 50' into an oxide layer 50 and forming a source electrode 6s, a drain electrode 6d and a conductive layer 60 (i.e., a source line layer) out of the conductive film. A number of holes or notches which expose the oxide layer 50 are cut through the conductive layer 60. Since the conductive film to be a source line layer and the oxide semiconductor film 50' can be patterned in this manner with a single photomask, the manufacturing process can be simplified and the manufacturing cost can be cut down.

As the conductive film, a stack of films with a multilayer structure consisting of Ti, Al and Ti layers, for example, may be used. The lower Ti layer may have a thickness of about 50 nm, the Al layer may have a thickness of about 200 nm, and the upper Ti layer may have a thickness of about 100 nm.

Subsequently, as shown in FIG. 24(d), a reducing insulating layer 8r is formed so as not to cover the channel region of the oxide layer 50. The reducing insulating layer 8r is formed to contact with a portion of the oxide layer 50 where a conductor region to be a pixel electrode is going to be formed. The reducing insulating layer 8r is also arranged to cover the conductive layer 60 and also contacts with the upper surface of the oxide layer 50 that is exposed inside the holes or notches of the conductive layer 60.

The reducing insulating layer 8r may be formed by CVD and photolithographic processes, for example. The reducing insulating layer 8r may be deposited under the condition including a substrate temperature of about 100° C. to about 250° C. (e.g., about 220° C.) and an $SiH_4/NH_3$ mixed gas flow rate ratio (i.e., the ratio of the $SiN_4$ flow rate to the $NH_3$ flow rate) of 4 to 20. When viewed along a normal to the substrate 1, an end portion of the reducing insulating layer 8r may overlap with the drain electrode 6d. If the reducing insulating layer 8r is formed in this manner, the conductor region (i.e., the lower transparent electrode) to be described later can be extended to reach the vicinity of the end portion of the drain electrode 6d which is located opposite from the channel region. As a result, the aperture ratio of the pixel can be increased. The reducing insulating layer 8a may be made of $SiN_x$ and may have a thickness of about 100 nm.

A portion of the oxide layer 50 which contacts with the reducing insulating layer 8r is reduced by hydrogen, for example, included in the reducing insulating layer 8r to turn into conductor regions 55 and 57. In addition, another portion of the oxide layer 50 which is located under an end portion of the drain electrode 6d may also have its resistance lowered by that hydrogen diffusing and may form part of the conductor region 55, too. Meanwhile, the rest of the oxide layer 50 which has not had its resistance lowered turns into semiconductor regions 51 and 52.

Next, as shown in FIG. 24(e), an insulating protective layer 8b to contact with the channel region of the semiconductor region 51 is deposited by CVD process, for example, over the oxide layer 50 and the source line layer. In this embodiment, the reducing insulating layer 8r and the insulating protective layer 8b together form a dielectric layer to be a storage capacitor. The insulating protective layer 8b may be made of $SiO_2$, for example, and may have a thickness of about 265 nm. A contact hole (not shown) is formed in the insulating protective layer 8b by a known method. Optionally, after the insulating protective layer 8b is formed, a heat treatment (annealing process) may be carried out at a temperature (of about 300° C., for example) which is equal to or higher than the deposition temperature at which the insulating protective layer 8b has been deposited. By conducting the heat treatment, hydrogen included in the reducing insulating layer 8r can be diffused through the oxide layer 50 more easily, and the electrical resistance of the conductor region 55 can be further lowered.

Subsequently, although not shown, a transparent conductive film is deposited by sputtering process, for example, over the insulating protective layer 8b and then patterned, thereby forming an upper transparent electrode 9. At least a portion of the upper transparent electrode 9 overlaps with the conductor region 55 with the dielectric layer (consisting of the reducing insulating layer 8r and the insulating protective layer 8b in this case) interposed between them. The upper transparent electrode 9 may be made of ITO, for example, and may have a thickness of about 100 nm.

The transparent conductive film to be patterned into this upper transparent electrode 9 may be used as not only a common electrode but also an extended line to be electrically connected to a source metal layer that is formed out of the same conductive film as the source line (source bus line) or a gate metal layer that is formed out of the same conductive film as the gate line (gate bus line). As a result, a TFT substrate including an integrated driver can be formed and a display device of high quality can be fabricated.

(Embodiment C2)

The reducing insulating layer 8r may also be arranged to contact with the lower surface of the oxide layer 50. Hereinafter, an exemplary configuration in which the reducing insulating layer 8r is arranged under the oxide layer 50 will be described.

Figure 25:
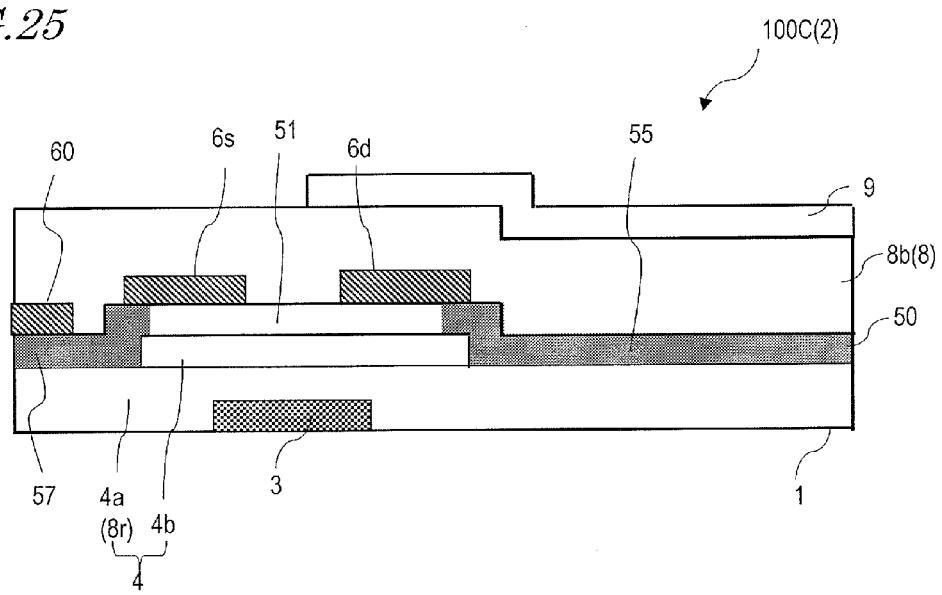
FIG. 25 A schematic cross-sectional view of a TFT substrate 100C(2) according to Embodiment C2 of the present invention.

FIG. 25 is a schematic cross-sectional view of the TFT substrate 100C(2) and corresponds to the cross-sectional view of the TFT substrate 100C(1) shown in FIG. 21(b). In FIG. 25, any component also included in the TFT substrate 100C(1) and having substantially the same function as its counterpart is identified by the same reference numeral as its counterpart's and description thereof will be omitted herein to avoid redundancies.

In this TFT substrate 100C(2), the insulating layer 4a that forms the lower part of the gate insulating layer also function as a reducing insulating layer 8r. The insulating layer 4a is arranged so as to contact with portions of the oxide layer 50. Those portions of the oxide layer 50 that contact with the insulating layer 4a will be conductor regions 55 and 57. Meanwhile, an insulating layer 4b that does not have the property to reduce an oxide semiconductor is provided between a portion of the oxide layer 50 that functions as an active layer and the reducing insulating layer (insulating layer 4a). That is why that portion that functions as an active layer does not turn into a conductor even when contacting with the insulating layer 4a but is left as a semiconductor region 51.

In this embodiment, the conductor region 57 is arranged in a portion of the oxide layer 50 that contacts with the reducing insulating layer 8r irrespective of the locations and shapes of the holes of the conductive layer 60. That is why in some cases, almost all of the portions of the oxide layer 50 that are covered with the conductive layer 60 may turn into the conductor regions 57. Also, since the reducing insulating layer is arranged under the oxide layer 50, the insulating layer (dielectric layer) 8 does not have to include any reducing insulating layer.

Figure 26:
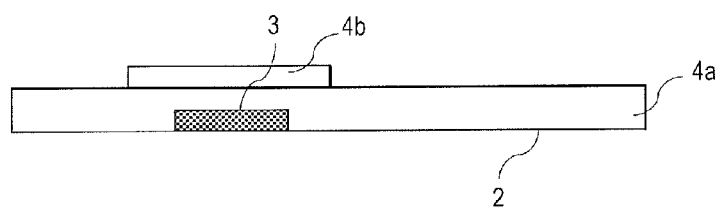
FIG. 26 (*a*) and (*b*) are schematic cross-sectional views illustrating respective manufacturing process steps to fabricate the TFT substrate 100C(2) of Embodiment C2.
Figure 26:
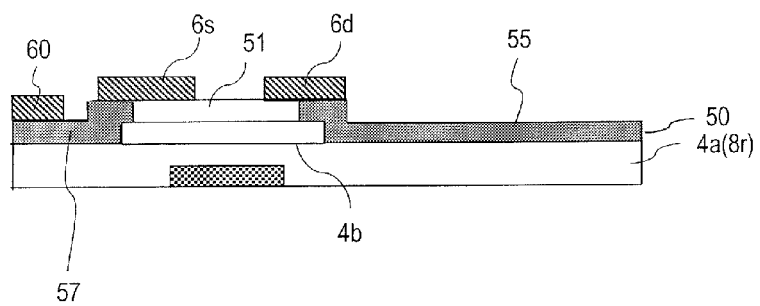

Hereinafter, an exemplary method for fabricating this TFT substrate 100C(2) will be described with reference to FIG. 26. FIGS. 26(a) to 26(c) are schematic cross-sectional views illustrating respective manufacturing process steps to fabricate the TFT substrate 100C(2).

First, as shown in FIG. 26(a), a gate electrode 3 and insulating layers 4a and 4b are formed on the substrate 1 by a known method. In this process step, the insulating layer 4a is made of the material to make the reducing insulating layer 8r described above. Also, the insulating layer 4b is formed on only a selected portion of the insulating layer 4a.

Next, as shown in FIG. 26(b), an oxide semiconductor film and a conductive film are formed over the insulating layers 4a and 4b and then patterned by the same method as what has already been described with reference to FIG. 24, thereby obtaining an oxide layer 50, a source electrode 6s, a drain electrode 6d and a conductive layer 60. Portions of the oxide layer 50 that contact with the insulating layer 4a turn into conductor regions 55 and 57. The rest of the oxide layer 50 that does not contact with the insulating layer 4a is left as semiconductor regions 51 and 52.

Thereafter, although not shown, an upper insulating layer 8 is formed over the source line layer and the oxide layer 50. Next, an upper transparent electrode 9 is formed on the upper insulating layer 8 to complete the TFT substrate 100C(2).

The upper insulating layer 8 suitably includes an insulating protective layer 8b which contacts with the channel region of the semiconductor region 51. As in the example illustrated in FIG. 25, an insulating protective layer 8b may be formed as the upper insulating layer 8.

(Embodiment C3)

Figure 27:
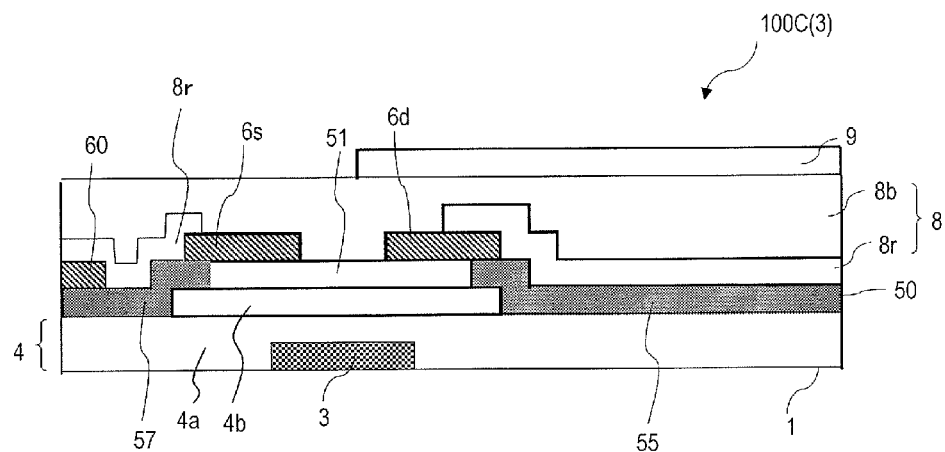
FIG. 27 A schematic cross-sectional view illustrating a TFT substrate 100C(3) according to Embodiment C3 of the present invention.

FIG. 27 is a cross-sectional view illustrating a TFT substrate 100C(3) as Embodiment C3 according to the present invention. In the TFT substrate 100C(3) shown in FIG. 27, both of the upper and lower surfaces of the conductor region 55 are in contact with reducing insulating layers, which is a difference from the TFT substrates 100C(1) and 100C(2) described above.

In this TFT substrate 100C(3), the upper insulating layer 8 includes a reducing insulating layer 8r which contacts with conductor regions 55, 57 and an insulating protective layer 8b which covers the channel region of a semiconductor region 51. Also, an insulating layer 4a which forms the lower part of a gate insulating layer 4 also functions as a reducing insulating layer. The lower surface of the conductor regions 55 and 57 is in contact with an insulating layer 4b. The insulating layer 4b that forms the upper part of the gate insulating layer 4 is arranged between the insulating layer 4a and the semiconductor region 51 of an oxide layer 50. Thus, the semiconductor region 51 is not in contact with neither the insulating layer 4a nor the reducing insulating layer 8r.

In this embodiment, upper and lower surfaces of a region of the oxide layer 50 to turn into a conductor region are both in contact with the insulating layers 4a and 8a that function as reducing insulating layers. Consequently, the electrical resistance of the conductor regions 55 and 57 can be further lowered.

This TFT substrate 100C(3) may be fabricated by the following method, for example.

To fabricate this TFT substrate 100C(3), first of all, a gate electrode 3, insulating layers 4a, 4b, an oxide layer 50, source and drain electrodes 6s, 6d, and conductive layer 60 are formed on the substrate 1 by the same method as what has already been described with reference to FIG. 26. Subsequently, a reducing insulating layer 8r is formed on the oxide layer 50 by the method that has already been described with reference to FIG. 24(d). The reducing insulating layer 8r is formed so as not to contact with the channel region of the oxide layer 50. Also, when viewed along a normal to the substrate 1, an end portion of the reducing insulating layer 8r suitably overlaps with the drain electrode 6d. After that, an insulating protective layer 8b which contacts with the channel region of the semiconductor region 51 is formed over the reducing insulating layer 8r, and an upper transparent electrode 9 is formed on the insulating protective layer 8b. In this manner, the TFT substrate 100C(3) shown in FIG. 27 is completed.

(Embodiment C4)

In the embodiments described above, at least one of the gate insulating layer 4 and the dielectric layer 8 includes a reducing insulating layer. In this embodiment, however, a reducing insulating layer 8r is provided separately from these layers 4 and 8, which is a difference from those embodiments.

Figure 28:
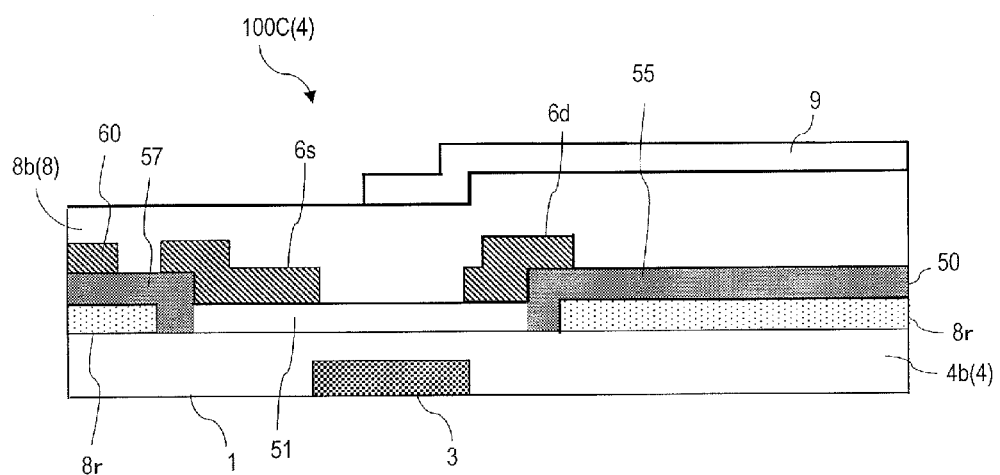
FIG. 28 A schematic cross-sectional view illustrating a TFT substrate 100C(4) according to Embodiment C4 of the present invention.

FIG. 28 is a schematic cross-sectional view of a TFT substrate 100C(4) as Embodiment C4. In FIG. 28, any component also included in the TFT substrate 100C(1) and having substantially the same function as its counterpart is identified by the same reference numeral as its counterpart's and description thereof will be omitted herein to avoid redundancies.

In this TFT substrate 100C(4), a reducing insulating layer 8r is arranged between the gate insulating layer 4 (that is an insulating layer 4b in this embodiment) and the oxide layer 50. The reducing insulating layer 8r is provided on only a selected portion of the gate insulating layer 4. The lower surface of the conductor regions 55 and 57 of the oxide layer 50 is in contact with the reducing insulating layer 8r, but the lower surface of the semiconductor region 51 is not in contact with the reducing insulating layer 8r. In the example illustrated in FIG. 28, the upper insulating layer 8 includes an insulating protective layer 8b but does not include any reducing insulating layer. However, the upper insulating layer 8 may include another reducing insulating layer which contacts with the upper surface of the conductor regions 55 and 57.

INDUSTRIAL APPLICABILITY

Embodiments of the present invention are applicable broadly to various types of devices that use a thin-film transistor. Examples of such devices include circuit boards such as an active-matrix substrate, display devices such as a liquid crystal display, an organic electroluminescence (EL) display, and an inorganic electroluminescence display, image capture devices such as an image sensor, and electronic devices such as an image input device and a fingerprint scanner.

REFERENCE SIGNS LIST 1 substrate
2 lower transparent electrode 3 gate electrode
4 gate insulating layer
4a, 4b, 4c insulating layer
6s source electrode
6d drain electrode
8 upper insulating layer
8a insulating protective layer
8b reducing insulating layer
9 upper transparent electrode
9t external connecting layer
50 oxide layer
55, 57, 58, 59 conductor region
51, 52, 53, 54 semiconductor region
60 conductive layer
61 line
62 source connecting layer
66 hole
150 liquid crystal layer
100, 100A, 100B, 100C semiconductor device (TFT substrate)
200 counter substrate
500, 600, 700 liquid crystal display device

The invention claimed is:

1. A semiconductor device comprising:
   a substrate;
   a gate electrode formed on the substrate;
   a gate insulating layer formed over the gate electrode;
   an oxide layer which is formed on the gate insulating layer and which includes a first semiconductor region and a first conductor region, wherein the first semiconductor region overlaps at least partially with the gate electrode with the gate insulating layer interposed between them;
   a source electrode formed to contact with the upper surface of the first semiconductor region of the oxide layer;
   a drain electrode which is formed to contact with the upper surface of the first semiconductor region of the oxide layer and which is electrically connected to the first conductor region; and
   a conductive layer which is formed to contact with the upper surface of the oxide layer and which has a plurality of holes or notches, wherein
   the oxide layer includes a plurality of second conductor regions, and each of which has an upper surface exposed inside respective one of the plurality of holes or notches of the conductive layer;
   the conductive layer includes a line, and the line includes at least some of the plurality of holes or notches; and
   the semiconductor device further includes an insulating layer covering the conductive layer such that, in the at least some of the plurality of holes or notches of the line, at least some of the plurality of second conductor regions are in direct contact with the insulating layer.

2. The semiconductor device of claim 1, further comprising a terminal portion,
   wherein the conductive layer includes a source connecting layer arranged in the terminal portion, and the source connecting layer has at least some of the plurality of holes or notches, and
   the terminal portion includes an external connecting layer which contacts with not only the upper surface of the source connecting layer but also at least some of the plurality of second conductor regions inside the at least some of the holes or notches of the source connecting layer.

3. The semiconductor device of claim 1, wherein the conductive layer has either a mesh pattern or a striped pattern.

4. The semiconductor device of claim 1, further comprising a terminal portion,
   wherein the oxide layer further includes another conductor region located in the terminal portion, and
   the terminal portion includes an external connecting layer which contacts with the upper surface of that another conductor region.

5. The semiconductor device of claim 1, wherein the conductive layer is formed out of the same conductive film as the source and drain electrodes.

6. The semiconductor device of claim 1, further comprising:
   an upper insulating layer formed over the source and drain electrodes; and
   an upper transparent electrode formed on the upper insulating layer,
   wherein the upper transparent electrode overlaps at least partially with the first conductor region with the upper insulating layer interposed between them.

7. The semiconductor device of claim 1, wherein the oxide layer includes In, Ga and Zn.

8. The semiconductor device of claim 1, wherein the plurality of second conductor regions and the first conductor region are more heavily doped with a dopant than the first semiconductor region is.

9. The semiconductor device of claim 1, wherein
   each of the plurality of holes or notches of the conductive layer has a slit shape, the slit shapes of each of the plurality of holes or notches are arranged in a line to define a single stripe, and adjacent ones of the slit shapes of each of the plurality of holes or notches are spaced apart by an interval of 2 μm to 10 μm.

10. A method for fabricating a semiconductor device, the method comprising the steps of:
    (A) providing a substrate having a gate electrode and a gate insulating layer formed on a surface thereof;
    (B) forming an oxide semiconductor layer on the gate insulating layer and forming a source electrode, a drain electrode and a conductive layer which contact with the upper surface of the oxide semiconductor layer, the conductive layer having a plurality of holes or notches which expose the upper surface of the oxide semiconductor layer;
    (C) forming a protective layer which covers at least a portion of the oxide semiconductor layer to be a channel region; and
    (D) forming an oxide layer including a first conductor region, a first semiconductor region including a channel region, and a plurality of second conductor regions by performing a resistance lowering process to lower the resistance of a portion of the oxide semiconductor layer, wherein the first conductor region is formed in a portion of the oxide semiconductor layer which is covered with neither the protective layer nor the conductive layer, the plurality of second conductor regions are formed in portions of the conductive layer which are exposed inside the holes or notches, and the first semiconductor region is formed in a portion of the oxide semiconductor layer that has not had its resistance lowered; wherein
    the conductive layer includes a line, and the line includes at least some of the plurality of holes or notches, and in the at least some of the plurality of holes or notches of the line, an insulating layer is formed to cover the conductive layer which contacts at least some of the plurality of second conductor regions.

11. The method of claim 10, wherein the conductive layer includes a source connecting layer, the source connecting layer has at least some of the plurality of holes or notches, and the method includes, after the step (D), the step of forming an external connecting layer which contacts with not only the upper surface of the source connecting layer but also at least some of the plurality of second conductor regions.

12. The method of claim 10, wherein the oxide semiconductor layer includes In, Ga and Zn.

* * * * *